(12) United States Patent
Yada et al.

(10) Patent No.: US 11,501,835 B2
(45) Date of Patent: Nov. 15, 2022

(54) THREE-DIMENSIONAL MEMORY DEVICE AND METHOD OF ERASING THEREOF FROM A SOURCE SIDE

(71) Applicant: SANDISK TECHNOLOGIES LLC, Addison, TX (US)

(72) Inventors: Shinsuke Yada, Yokkaichi (JP); Hiroyuki Ogawa, Yokkaichi (JP)

(73) Assignee: SANDISK TECHNOLOGIES LLC, Addison, TX (US)

(*) Notice: Subject to any disclaimer, the term of this patent is extended or adjusted under 35 U.S.C. 154(b) by 0 days.

(21) Appl. No.: 17/158,395

(22) Filed: Jan. 26, 2021

(65) Prior Publication Data
US 2022/0238162 A1    Jul. 28, 2022

(51) Int. Cl.
| | |
|---|---|
| G11C 16/00 | (2006.01) |
| G11C 16/16 | (2006.01) |
| G11C 16/30 | (2006.01) |
| G11C 16/24 | (2006.01) |
| G11C 16/08 | (2006.01) |
| H01L 27/11524 | (2017.01) |
| H01L 27/11582 | (2017.01) |
| H01L 27/11519 | (2017.01) |
| H01L 27/11565 | (2017.01) |
| H01L 27/1157 | (2017.01) |
| H01L 27/11556 | (2017.01) |

(52) U.S. Cl.
CPC .............. *G11C 16/16* (2013.01); *G11C 16/08* (2013.01); *G11C 16/24* (2013.01); *G11C 16/30* (2013.01); *H01L 27/1157* (2013.01); *H01L 27/11519* (2013.01); *H01L 27/11524* (2013.01); *H01L 27/11556* (2013.01); *H01L 27/11565* (2013.01); *H01L 27/11582* (2013.01)

(58) Field of Classification Search
CPC ..... G11C 16/0483; G11C 16/08; G11C 16/10; G11C 16/24; G11C 16/26; G11C 16/04; H01L 27/1157; H01L 27/11575; H01L 27/11582; H01L 29/7926; H01L 29/792
USPC .................. 365/148, 185.11, 185.17, 189.15
See application file for complete search history.

(56) References Cited

U.S. PATENT DOCUMENTS

| | | | |
|---|---|---|---|
| 9,985,098 B2 | 5/2018 | Matsumoto et al. |
| 10,008,570 B2 | 6/2018 | Yu et al. |
| 10,020,363 B2 | 7/2018 | Ogawa et al. |
| 10,381,443 B2 | 8/2019 | Matsumoto et al. |

(Continued)

OTHER PUBLICATIONS

Endoh et al., "Novel Ultra High Density Memory with a Stacked-Surrounding Gate Transistor (S-SGT) Structured Cell," IEDM Proc. (2001) 33-36.

(Continued)

*Primary Examiner* — Thong Q Le
(74) *Attorney, Agent, or Firm* — The Marbury Law Group PLLC

(57) ABSTRACT

A method of erasing vertical NAND strings from a source side of the vertical NAND strings includes applying a relatively high erase voltage to a source line, applying a relatively low voltage or 0 V to bit lines, applying a first drain-select-level voltage that is less than the erase voltage to one of the first drain-select-level electrically conductive layers, and applying a second drain-select-level voltage that is greater than the first drain-select-level voltage and not greater than the erase voltage to one of the second drain-select-level electrically conductive layers.

19 Claims, 29 Drawing Sheets

(56) References Cited

U.S. PATENT DOCUMENTS

| | | |
|---|---|---|
| 10,566,059 B2 | 2/2020 | Diep et al. |
| 10,629,613 B1 | 4/2020 | Shimizu et al. |
| 2018/0122904 A1 | 5/2018 | Matsumoto et al. |
| 2018/0122905 A1 | 5/2018 | Ogawa et al. |
| 2018/0122906 A1 | 5/2018 | Yu et al. |
| 2018/0261671 A1 | 9/2018 | Matsumoto et al. |
| 2019/0333581 A1 | 10/2019 | Diep et al. |
| 2021/0217478 A1* | 7/2021 | Oh .......................... H01L 25/18 |

OTHER PUBLICATIONS

U.S. Appl. No. 16/697,560, filed Nov. 27, 2019, SanDisk Technologies LLC.
U.S. Appl. No. 16/828,129, filed Mar. 24, 2020, SanDisk Technologies LLC.
U.S. Appl. No. 16/832,320, filed Mar. 27, 2020, SanDisk Technologies LLC.

* cited by examiner

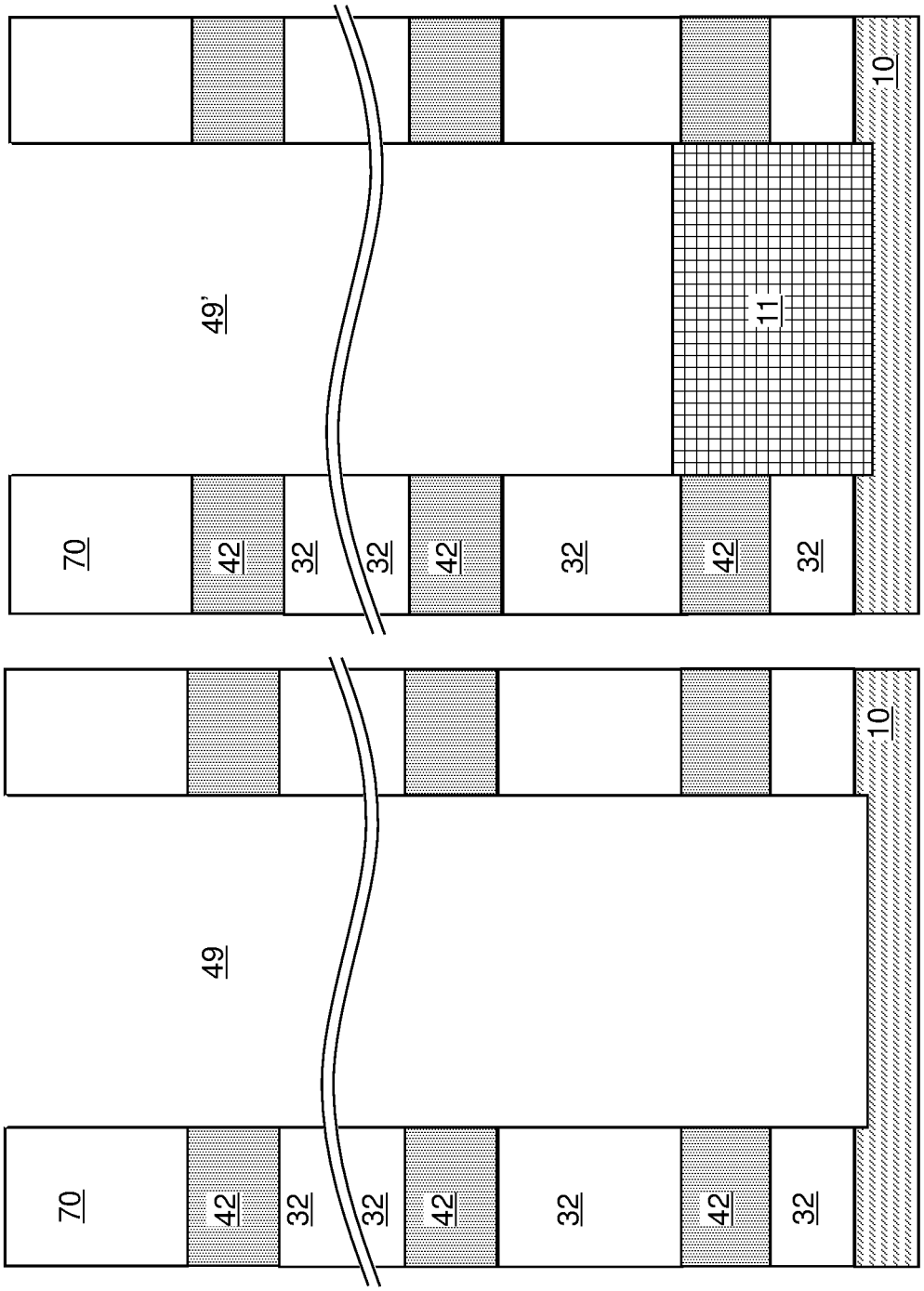

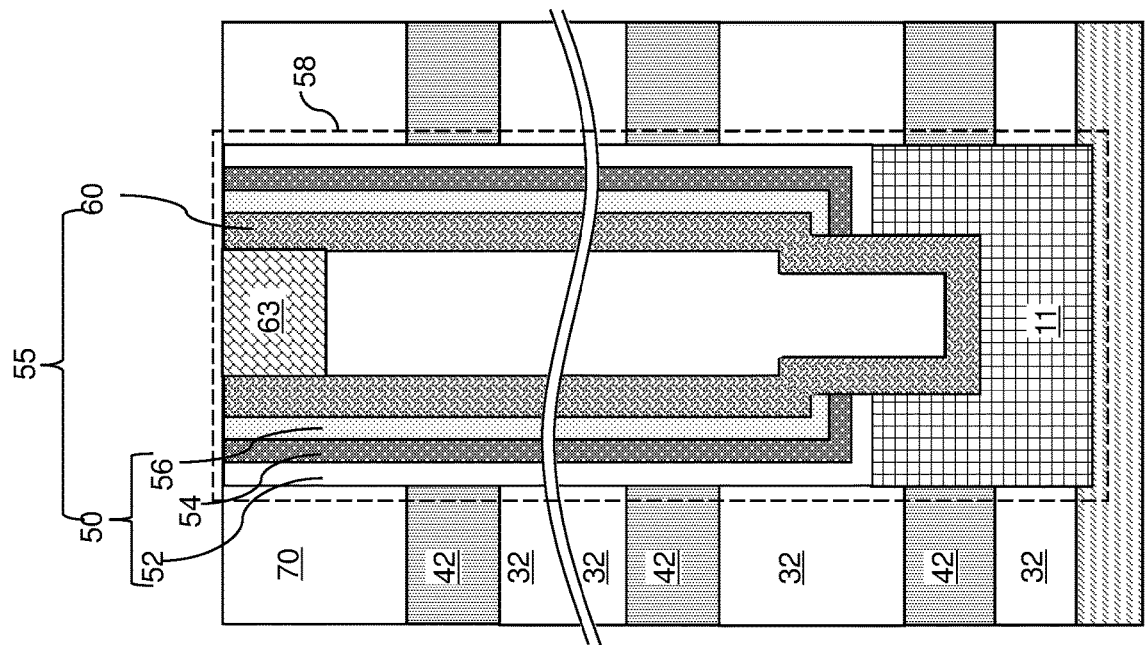
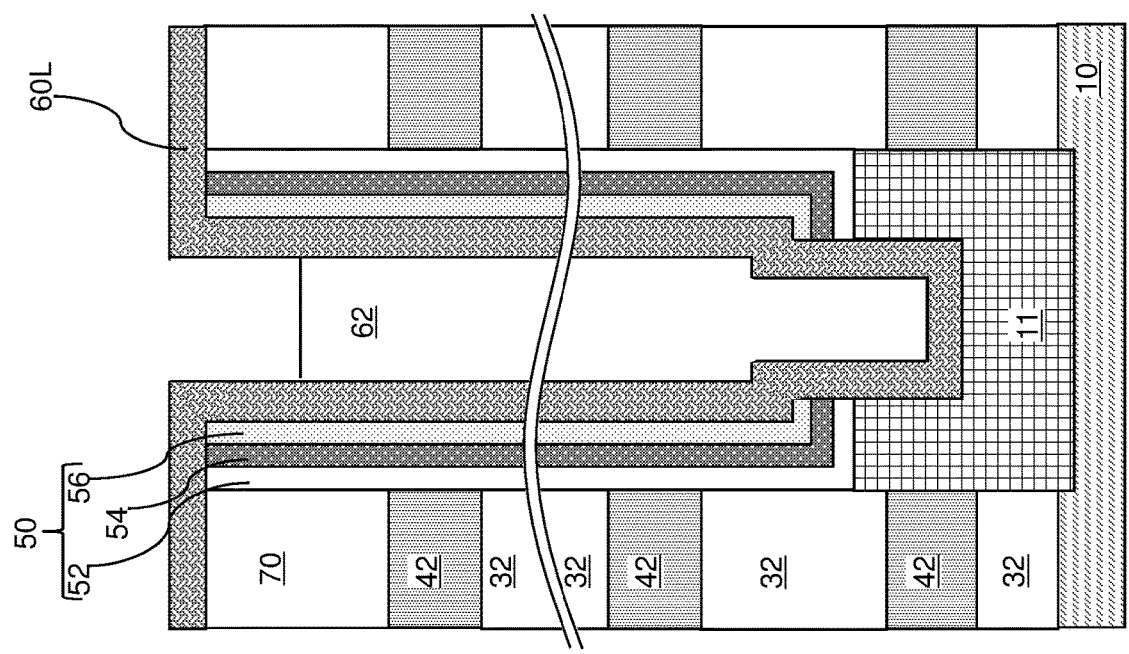

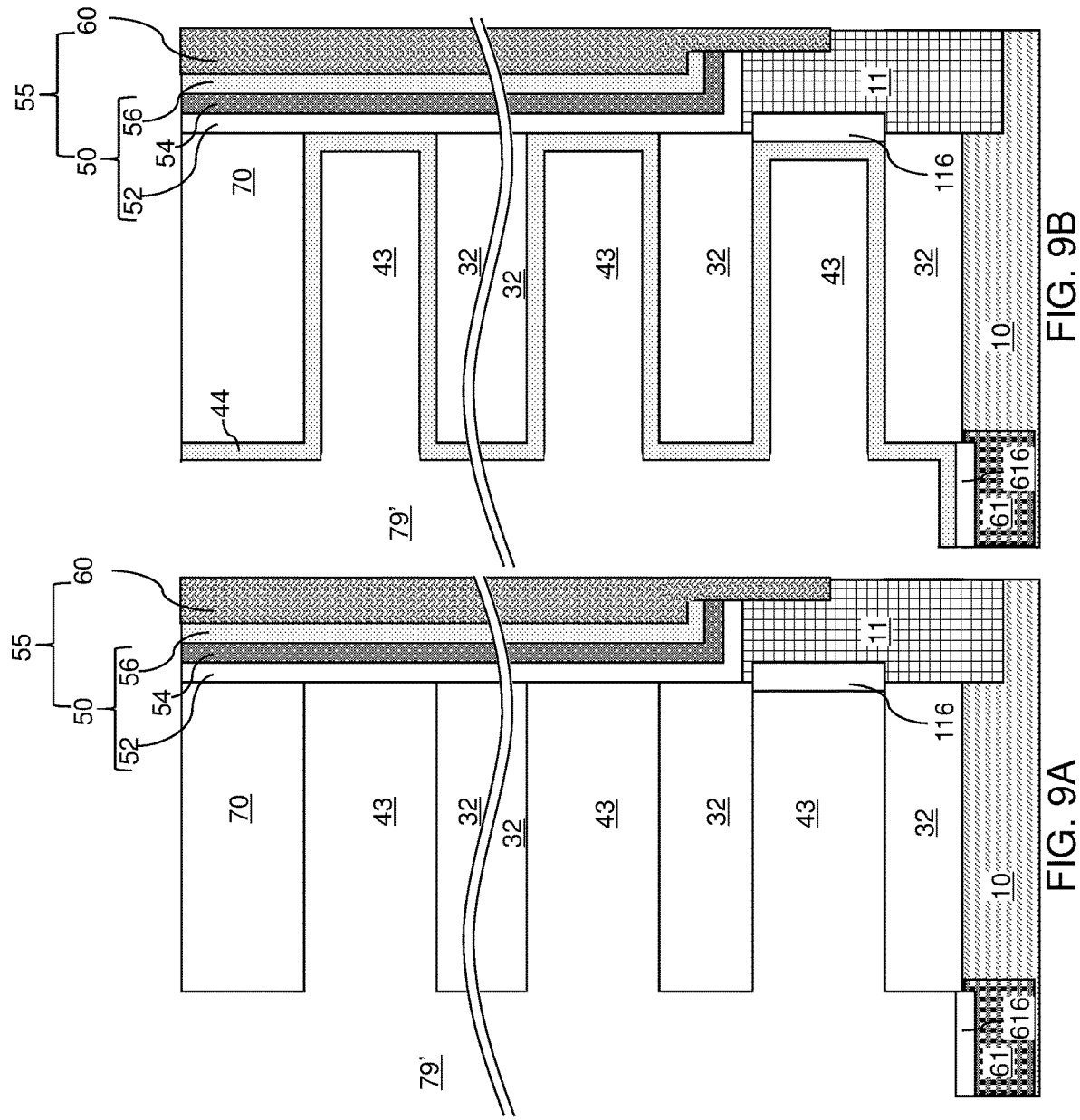

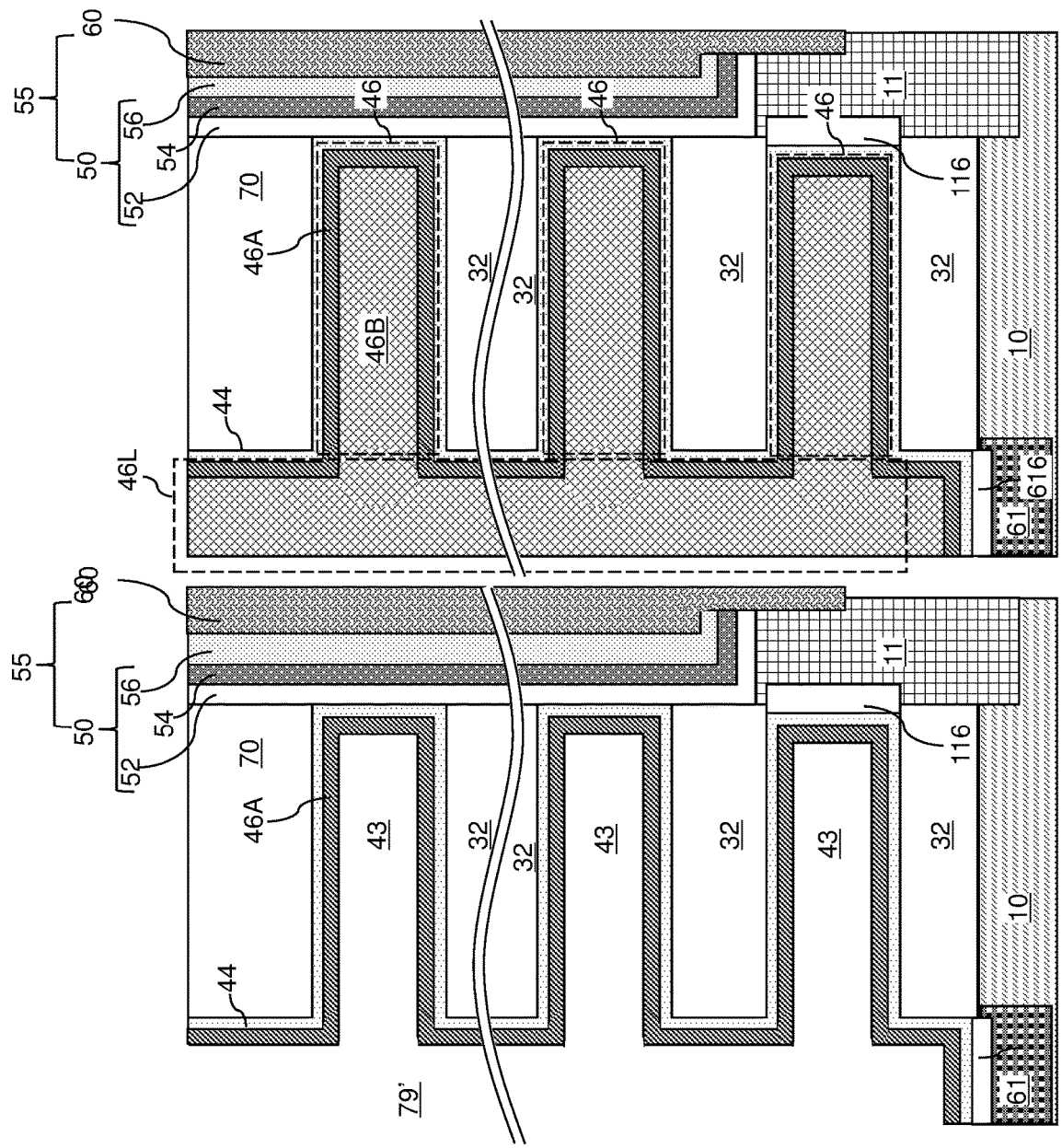

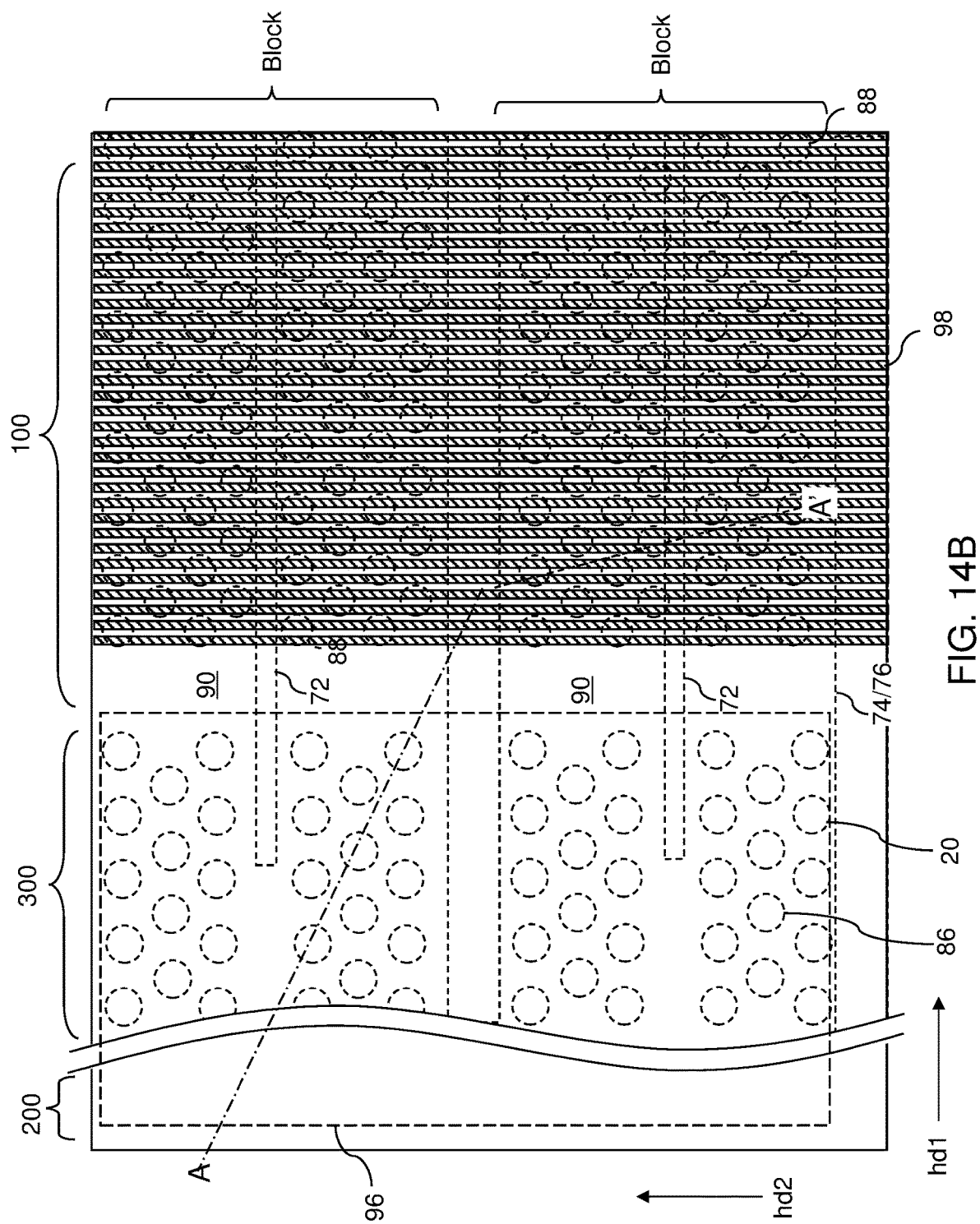

THREE-DIMENSIONAL MEMORY DEVICE AND METHOD OF ERASING THEREOF FROM A SOURCE SIDE

FIELD

The present disclosure relates generally to the field of semiconductor devices, and particularly to a three-dimensional memory device including a peripheral circuit for erasing the memory device from the source side and methods of operating thereof.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

In one embodiment, a three-dimensional memory device comprises an alternating stack of insulating layers and electrically conductive layers located over a substrate, wherein the electrically conductive layers comprise word-line-level electrically conductive layers, first drain-select-level electrically conductive layers overlying the word-line-level electrically conductive layers, located at a first drain select level, and laterally spaced apart from each other, and second drain-select-level electrically conductive layers located at a second drain select level between the first drain-select-level electrically conductive layers and the word-line-level electrically conductive layers, and laterally spaced apart from each other. The device further comprises blocks of vertical NAND strings that vertically extend through the alternating stack, wherein each of the vertical NAND strings comprises a respective vertical semiconductor channel, a drain region located at an upper end of the respective vertical semiconductor channel, and a respective vertical stack of memory elements located at levels of the word-line-level electrically conductive layers. The device further comprises a source line electrically connected to lower ends of the vertical semiconductor channels, bit lines overlying the vertical NAND strings and electrically connected to a respective subset of the drain regions, and an erase operation bias circuit configured to erase the vertical NAND strings in a selected block by applying a relatively high erase voltage to the source line, applying a relatively low voltage or 0 V to the bit lines, applying a first drain-select-level voltage that is less than the erase voltage to one of the first drain-select-level electrically conductive layers located within the selected block, and applying a second drain-select-level voltage that is greater than the first drain-select-level voltage and not greater than the erase voltage to one of the second drain-select-level electrically conductive layers located within the selected block.

In another embodiment, a memory device, comprises word-line-level electrically conductive layers, drain-select-level electrically conductive layers, blocks of NAND strings, bit lines, bit line bias transistors configured to electrically bias the bit lines, and drain-select-level bias transistors configured to electrically bias the drain-select-level electrically conductive layers, wherein the drain-select-level bias transistors have a greater gate dielectric thickness than the bit line bias transistors.

In another embodiment, a method of erasing the vertical NAND strings from a source side of the vertical NAND strings in a selected block includes applying a relatively high erase voltage to the source line, applying a relatively low voltage or 0 V to the bit lines, applying a first drain-select-level voltage that is less than the erase voltage to one of the first drain-select-level electrically conductive layers located within the selected block, and applying a second drain-select-level voltage that is greater than the first drain-select-level voltage and not greater than the erase voltage to one of the second drain-select-level electrically conductive layers located within the selected block.

BRIEF DESCRIPTION OF THE DRAWINGS

FIGS. 5A-5H are sequential schematic vertical cross-sectional views of a memory opening within the exemplary structure during formation of a memory stack structure, an optional dielectric core, and a drain region therein according to an embodiment of the present disclosure.

FIGS. 9A-9D are sequential vertical cross-sectional views of a region of the exemplary structure during formation of electrically conductive layers according to an embodiment of the present disclosure.

FIG. 14B is a partial see-through top-down view of the exemplary structure of FIG. 14A. The vertical plane A-A' is the plane of the schematic vertical cross-sectional view of FIG. 14A.

DETAILED DESCRIPTION

Figure 1:
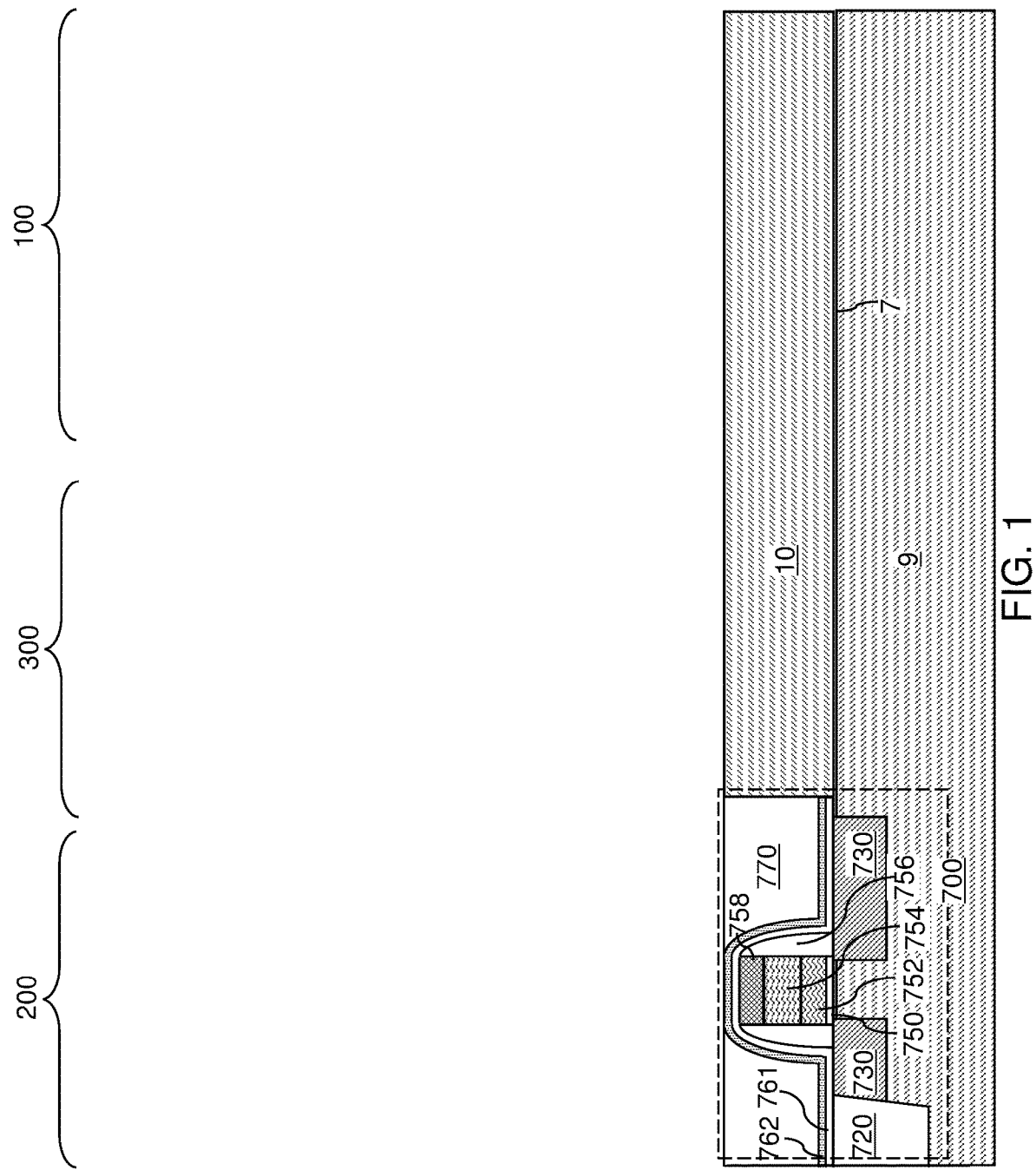
FIG. 1 is a schematic vertical cross-sectional view of an exemplary structure after formation of at least one peripheral device, a semiconductor material layer, and a gate dielectric layer according to an embodiment of the present disclosure.

As discussed above, the embodiments of the present disclosure are directed to three-dimensional memory devices including a peripheral circuit for erasing the memory device from the source side and methods of operating thereof. The embodiments of the disclosure can be employed to form three-dimensional memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or from each other, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

According to an aspect of the present disclosure, a source side NAND string erase operation includes applying a relatively low voltage or zero volts (e.g., electrically grounding) bit lines electrically connected to vertical semiconductor channels of vertical NAND strings within a selected block and unselected blocks, while a relatively high erase voltage is applied to the source side of each vertical semiconductor channel within the selected and unselected memory blocks.

Portions of vertical semiconductor channels within unselected memory blocks are electrically disconnected from the source by source-select-level electrodes that are electrically biased at the relatively high erase voltage to turn off adjacent portions of the vertical semiconductor channels within the unselected memory blocks. Drain-select-level electrodes for the unselected memory blocks can be electrically biased at a relatively low voltage or 0 V (e.g., electrically grounded). Word lines may be electrically floating, or may be electrically biased at a lower voltage than the erase voltage. Thus, portions of semiconductor channels within unselected blocks are electrically floating, and no data is erased within the unselected blocks.

Portions of the vertical semiconductor channels within the selected memory block are turned on by application of a source-side voltage, which differs (e.g., which has a lower magnitude) from the erase voltage to permit the source-select-level transistors to turn on. Portions of the selected vertical semiconductor channels located at the word line levels are electrically biased at the erase voltage. At the same time, the word lines may be electrically floating or may be electrically biased at a voltage lower than the erase voltage. This configuration allows erasing of all data within memory elements in the selected memory block.

Drain-select-level electrodes for the selected memory block can be electrically biased employing a differential drain-select-level biasing scheme to be described in more detail below. The differential drain-select-level biasing scheme electrically disconnects portions of the vertical semiconductor channels in the selected memory block from the bit lines by application of different drain-select-level voltages to different levels of drain-select-level electrodes. Specifically, a first drain-select-level electrode that is most proximal to the bit lines can be electrically biased at a relatively low voltage (e.g., zero volts) that is less than the erase voltage, and an additional drain-select-level electrode located between the first drain-select-level electrode and the word-line-level electrodes can be electrically biased at the erase voltage. In one embodiment, a vertical distance between the first drain-select-level electrode and the additional drain-select-level electrode can be greater than the vertical distance between the word lines to reduce the electrical field with portions of the vertical semiconductor channels located at the drain select levels. In another embodiment, more than two drain-select-level electrodes can be employed to reduce the electrical field within portions of the vertical semiconductor channels located at the drain select levels. For example, an intermediate drain-select-level electrode can be biased at a voltage between the relatively low voltage (e.g., zero volts) applied to the first drain-select-level electrode and the relatively high erase voltage applied to the additional drain-select-level electrode. Collateral programming of portions of memory films located at the level of the first drain-select-level electrode can be avoided or reduced.

Referring to FIG. 1, an exemplary structure according to an embodiment of the present disclosure is illustrated, which can be employed, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10. The substrate semiconductor layer 9 may be a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device for a peripheral circuit 700 can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuit 700 can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device for the peripheral circuit 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device for the peripheral circuit 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200.

In one alternative embodiment, the peripheral device region 200 containing the at least one semiconductor device 700 for a peripheral circuitry may be located under the memory array region 100 in a CMOS under array configuration. In another alternative embodiment, the peripheral device region 200 may be located on a separate substrate which is subsequently bonded to the memory array region 100.

Figure 2:
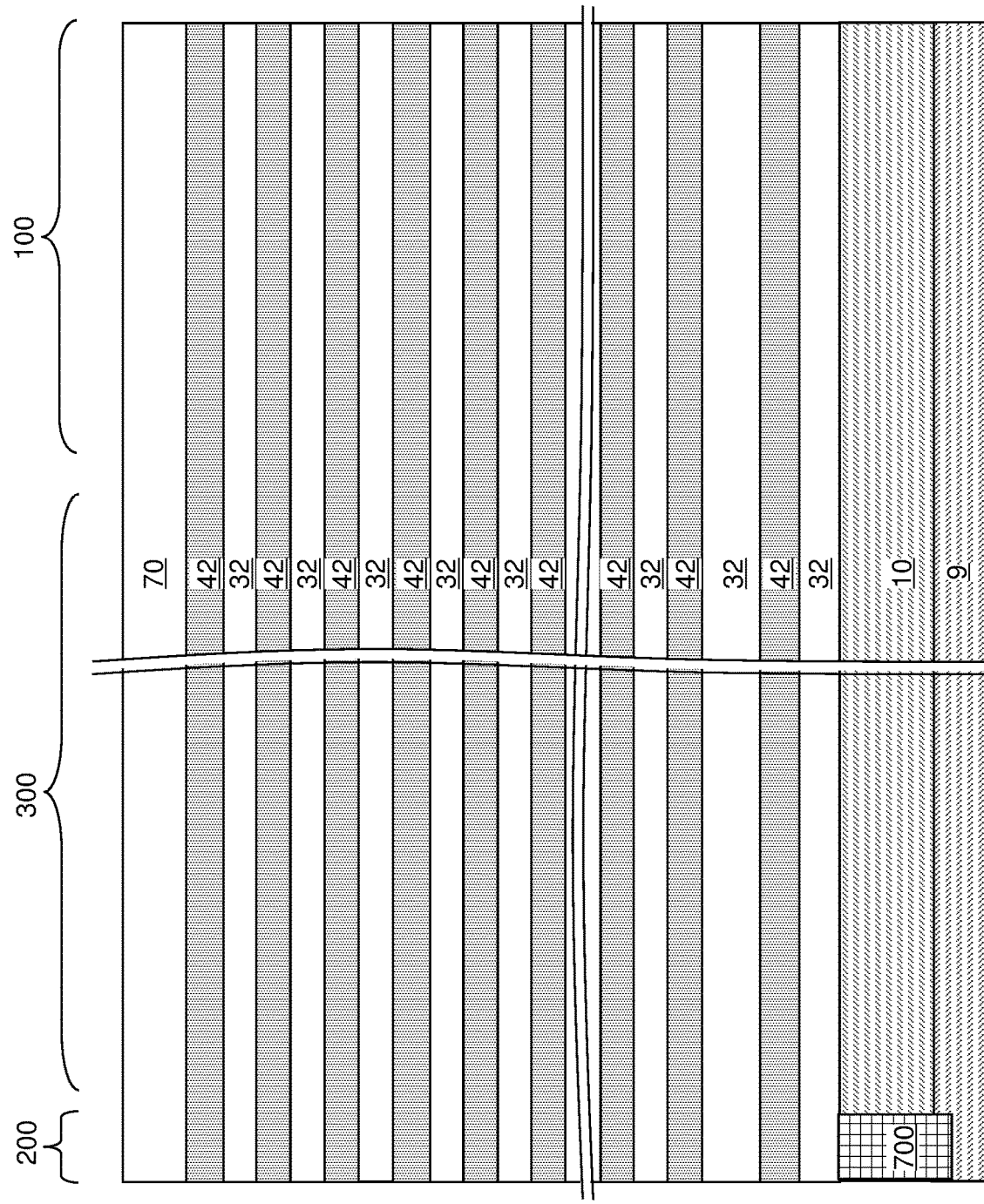
FIG. 2 is a schematic vertical cross-sectional view of the exemplary structure after formation of an alternating stack of insulating layers and sacrificial material layers according to an embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
FIG. 3 is a schematic vertical cross-sectional view of the exemplary structure after formation of stepped terraces and a retro-stepped dielectric material portion according to an embodiment of the present disclosure.

Referring to FIG. 3, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the contact region 300, which is located between the memory array region 100 and the peripheral device region 200 containing the at least one semiconductor device for the peripheral circuit 700. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction (e.g., word line direction) hd1 such that each vertical step has the height of a plurality of pairs of an insulating layer 32 and a sacrificial material layer 42, and the number of columns can be at least the number of the plurality of pairs. Each column of staircase can be vertically offset from each other such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction (e.g., bit line direction) hd2 that is perpendicular to the first horizontal direction hd1. In one embodiment, the first horizontal direction hd1 may be perpendicular to the boundary between the memory array region 100 and the contact region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Drain-select-level isolation structures 72 can be formed through the insulating cap layer 70 and a subset of the sacrificial material layers 42 located at drain-select-levels. The drain-select-level isolation structures 72 can be formed, for example, by forming drain-select-level isolation trenches and filling the drain-select-level isolation trenches with a dielectric material such as silicon oxide. Excess portions of the dielectric material can be removed from above the top surface of the insulating cap layer 70.

According to an aspect of the present disclosure, each drain-select-level isolation structures 72 can vertically extend through at least two topmost sacrificial material layers 42. In one embodiment, each drain-select-level isolation structures 72 can vertically extend through at least three topmost sacrificial material layers 42. Each level of the sacrificial material layers 42 through which the drain-select-level isolation structures 72 vertically extend comprises a drain select level, i.e., a level in which an electrode for selecting a block of NAND strings from a drain side is subsequently formed.

Figure 4A:
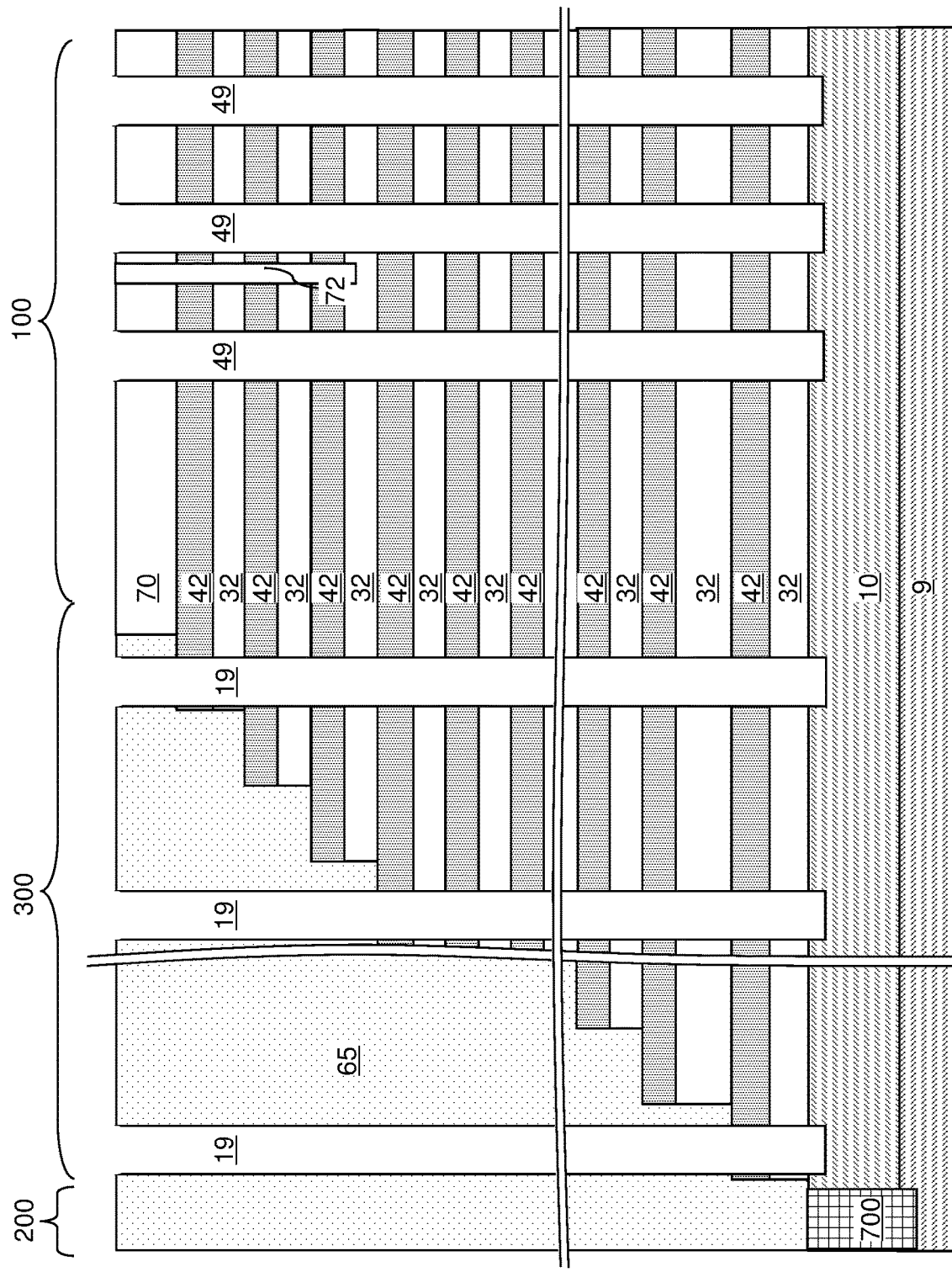
FIG. 4A is a schematic vertical cross-sectional view of the exemplary structure after formation of memory openings and support openings according to an embodiment of the present disclosure.
Figure 4B:
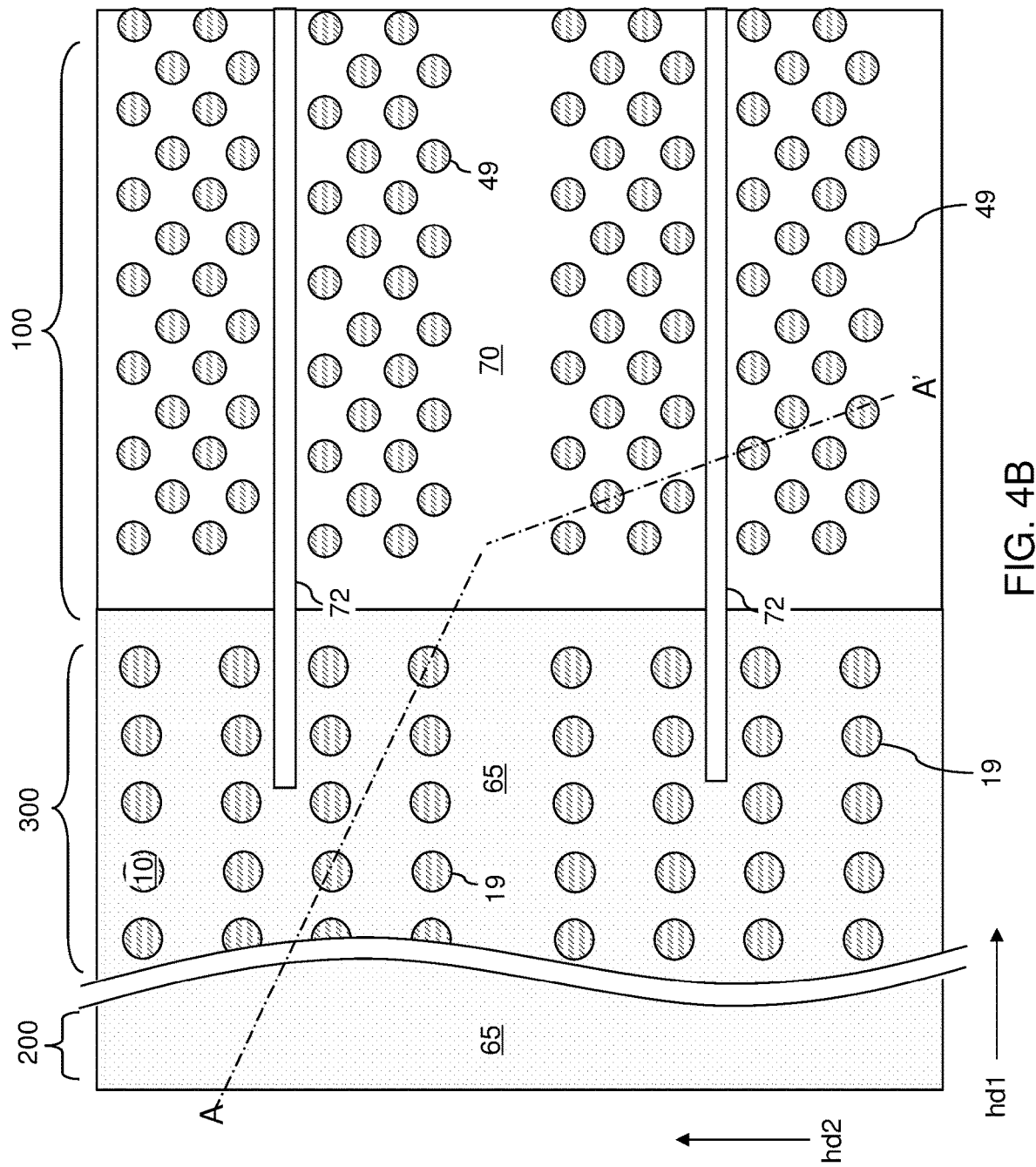
FIG. 4B is a top-down view of the exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5H illustrate structural changes in a memory opening 49, which is one of the memory openings 49 in the exemplary structure of FIGS. 4A and 4B. The same structural change occurs simultaneously in each of the other memory openings 49 and in each support opening 19.

Referring to FIG. 5A, a memory opening 49 in the exemplary device structure of FIGS. 4A and 4B is illustrated. The memory opening 49 extends through the insulating cap layer 70, the alternating stack (32, 42), and optionally into an upper portion of the semiconductor material layer 10. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 can be doped with electrical dopants of the same conductivity type as the semiconductor material layer 10. In one embodiment, the top surface of each pedestal channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the pedestal channel portions 11 with a respective conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Figure 5D:
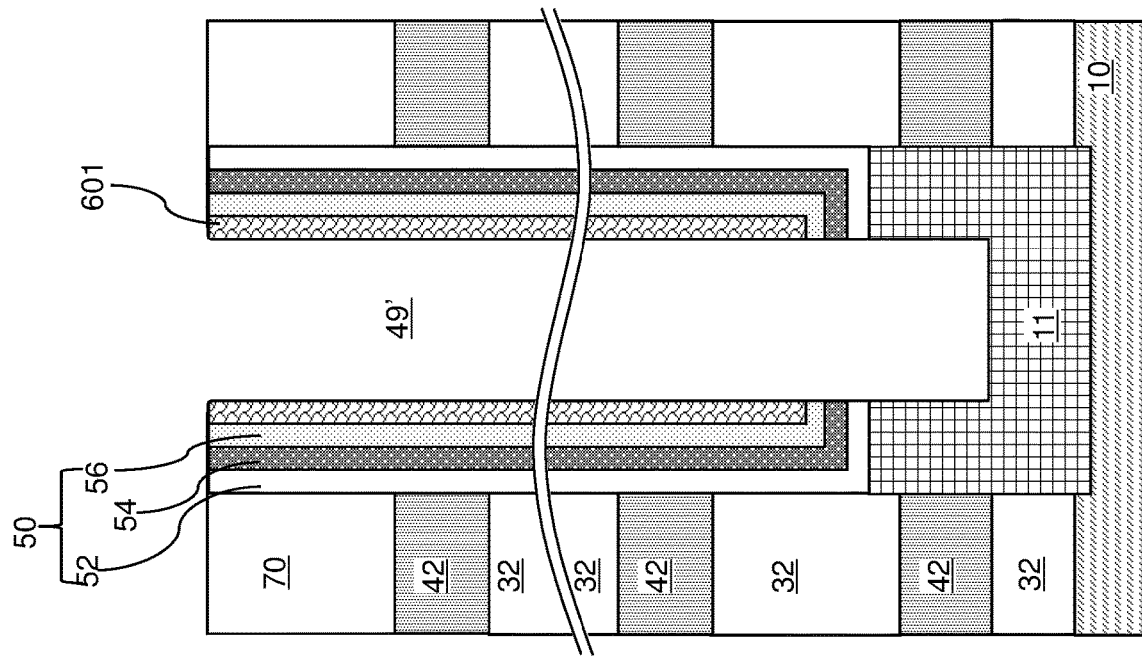
Figure 5C:
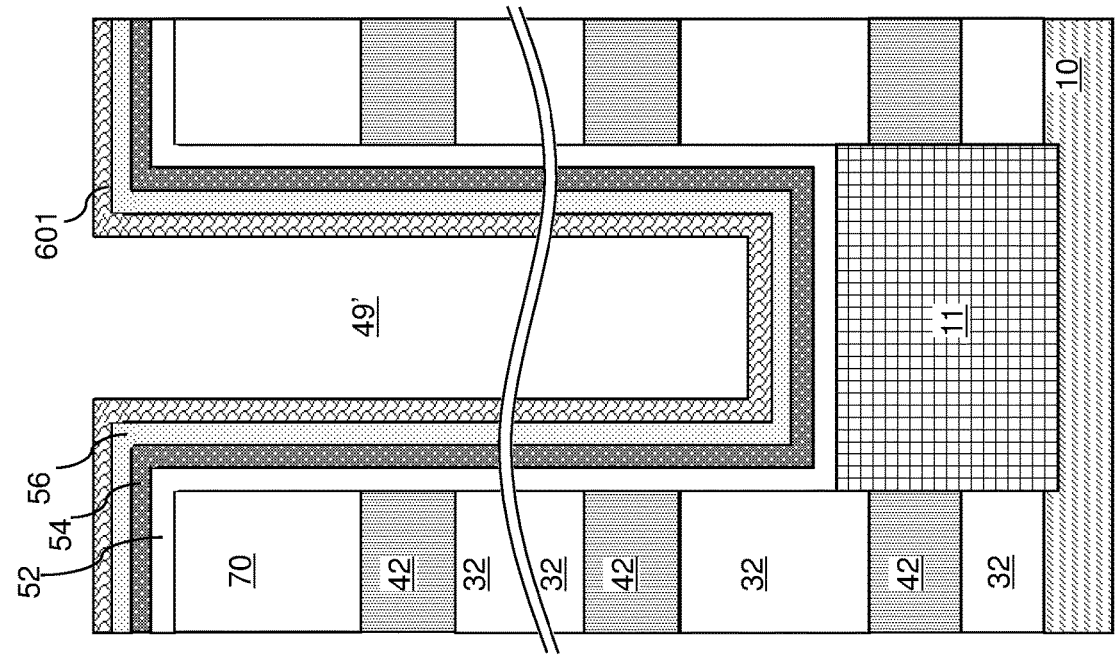
Figure 5E:
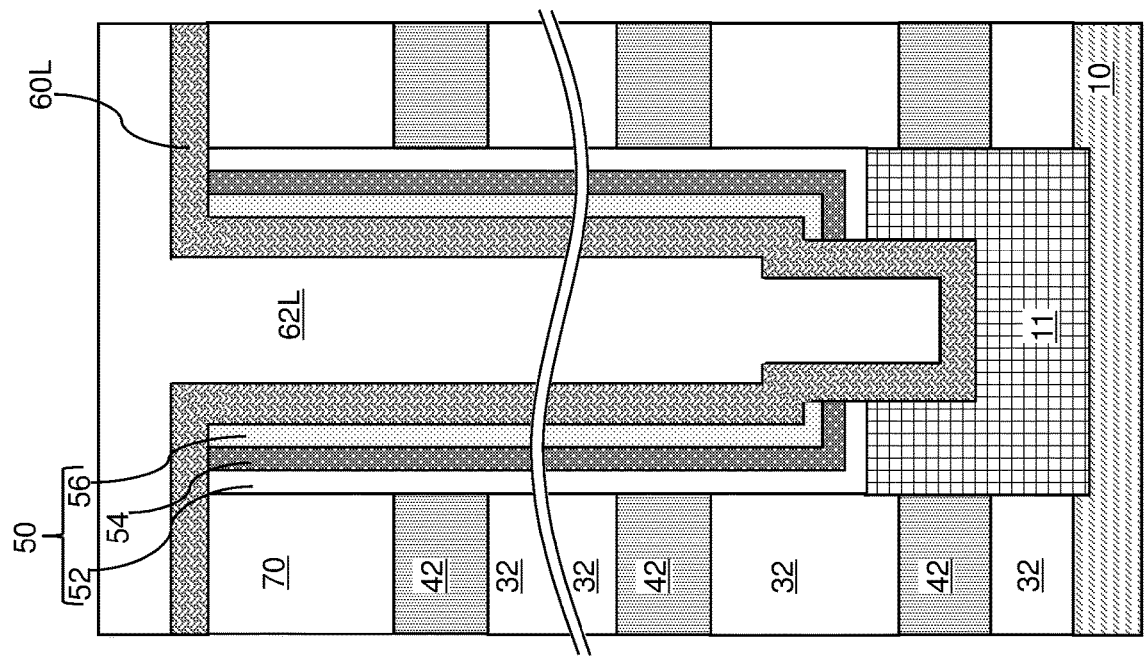

Referring to FIG. 5C, a stack of layers including a blocking dielectric layer 52, a memory material layer 54, a tunneling dielectric layer 56, and an optional sacrificial cover material layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the memory material layer 54 can be formed. In one embodiment, the memory material layer 54 can be a continuous layer or patterned discrete portions of a charge trapping material including a dielectric charge trapping material, which can be, for example, silicon nitride. Alternatively, the memory material layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the memory material layer 54 includes a silicon nitride layer. In one embodiment, the sacrificial material layers 42 and the insulating layers 32 can have vertically coincident sidewalls, and the memory material layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the memory material layer 54 as a plurality of memory material portions that are vertically spaced apart. While the present disclosure is described employing an embodiment in which the memory material layer 54 is a single continuous layer, embodiments are expressly contemplated herein in which the memory material layer 54 is replaced with a plurality of memory material portions (which can be charge trapping material portions or electrically isolated conductive material portions) that are vertically spaced apart. In one embodiment, each vertical stack of memory elements comprises a vertical stack of charge storage material portions that retain electrical charges therein upon programming.

The memory material layer 54 can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the memory material layer 54 may comprise an insulating charge trapping material, such as one or more silicon nitride segments. Alternatively, the memory material layer 54 may comprise conductive nanoparticles such as metal nanoparticles, which can be, for example, ruthenium nanoparticles. The memory material layer 54 can be formed, for example, by chemical vapor deposition (CVD), atomic layer deposition (ALD), physical vapor deposition (PVD), or any suitable deposition technique for storing electrical charges therein. The thickness of the memory material layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional sacrificial cover material layer 601 includes a sacrificial material that can be subsequently removed selective to the material of the tunneling dielectric layer 56. In one embodiment, the sacrificial cover material layer 601 can include a semiconductor material such as amorphous silicon, or may include a carbon-based material such as amorphous carbon or diamond-like carbon (DLC). The sacrificial cover material layer 601 can be formed by a conformal deposition method such as low pressure chemical vapor deposition (LPCVD). The thickness of the sacrificial cover material layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 5D, the optional sacrificial cover material layer 601, the tunneling dielectric layer 56, the memory material layer 54, the blocking dielectric layer 52 are sequentially anisotropically etched employing at least one anisotropic etch process. The portions of the sacrificial cover material layer 601, the tunneling dielectric layer 56, the memory material layer 54, and the blocking dielectric layer 52 located above the top surface of the insulating cap layer 70 can be removed by the at least one anisotropic etch process. Further, the horizontal portions of the sacrificial cover material layer 601, the tunneling dielectric layer 56, the memory material layer 54, and the blocking dielectric layer 52 at a bottom of each memory cavity 49' can be removed to form openings in remaining portions thereof. Each of the sacrificial cover material layer 601, the tunneling dielectric layer 56, the memory material layer 54, and the blocking dielectric layer 52 can be etched by a respective anisotropic etch process employing a respective etch chemistry, which may, or may not, be the same for the various material layers.

Each remaining portion of the sacrificial cover material layer 601 can have a tubular configuration. The memory material layer 54 can comprise a charge trapping material or a floating gate material. In one embodiment, each memory material layer 54 can include a vertical stack of charge storage regions that store electrical charges upon programming. In one embodiment, the memory material layer 54 can be a memory material layer in which each portion adjacent to the sacrificial material layers 42 constitutes a charge storage region.

A surface of the pedestal channel portion 11 (or a surface of the semiconductor material layer 10 in case the pedestal channel portions 11 are not employed) can be physically exposed underneath the opening through the sacrificial cover material layer 601, the tunneling dielectric layer 56, the memory material layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. A tunneling dielectric layer 56 is located over the memory material layer 54. A set of a blocking dielectric layer 52, a memory material layer 54, and a tunneling dielectric layer 56 in a memory opening 49 constitutes a memory film 50, which includes a plurality of charge storage regions (comprising portions of the memory material layer 54) that are insulated from surrounding materials by the blocking dielectric layer 52 and the tunneling dielectric layer 56. In one embodiment, the sacrificial cover material layer 601, the tunneling dielectric layer 56, the memory material layer 54, and the blocking dielectric layer 52 can have vertically coincident sidewalls. The sacrificial cover material layer 601 can be subsequently removed selective to the material of the tunneling dielectric layer 56. In case the sacrificial cover material layer 601 includes a semiconductor material, a wet etch process employing hot trimethyl-2 hydroxyethyl ammonium hydroxide ("hot TMY") or tetramethyl ammonium hydroxide (TMAH) can be performed to remove the sacrificial cover material layer 601. Alternatively, the sacrificial cover material layer 601 may be retained in the final device if it comprises a semiconductor material Referring to FIG. 5E, a semiconductor channel layer 60L can be deposited directly on the semiconductor surface of the pedestal channel portion 11 or the semiconductor material layer 10 if the pedestal channel portion 11 is omitted, and directly on the tunneling dielectric layer 56. The semiconductor channel layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer 60L includes amorphous silicon or polysilicon. The semiconductor channel layer 60L can have a doping of a first conductivity type, which is the same as the conductivity type of the semiconductor material layer 10 and the pedestal channel portions 11. The semiconductor channel layer 60L can be formed by a conformal deposition method such as low pressure chemical vapor deposition (LPCVD). The thickness of the semiconductor channel layer 60L can be in a range from 2 nm to 10 nm, although lesser and greater thicknesses can also be employed. The semiconductor channel layer 60L may partially fill the memory cavity 49' in each memory opening, or may fully fill the cavity in each memory opening.

Figure 5F:
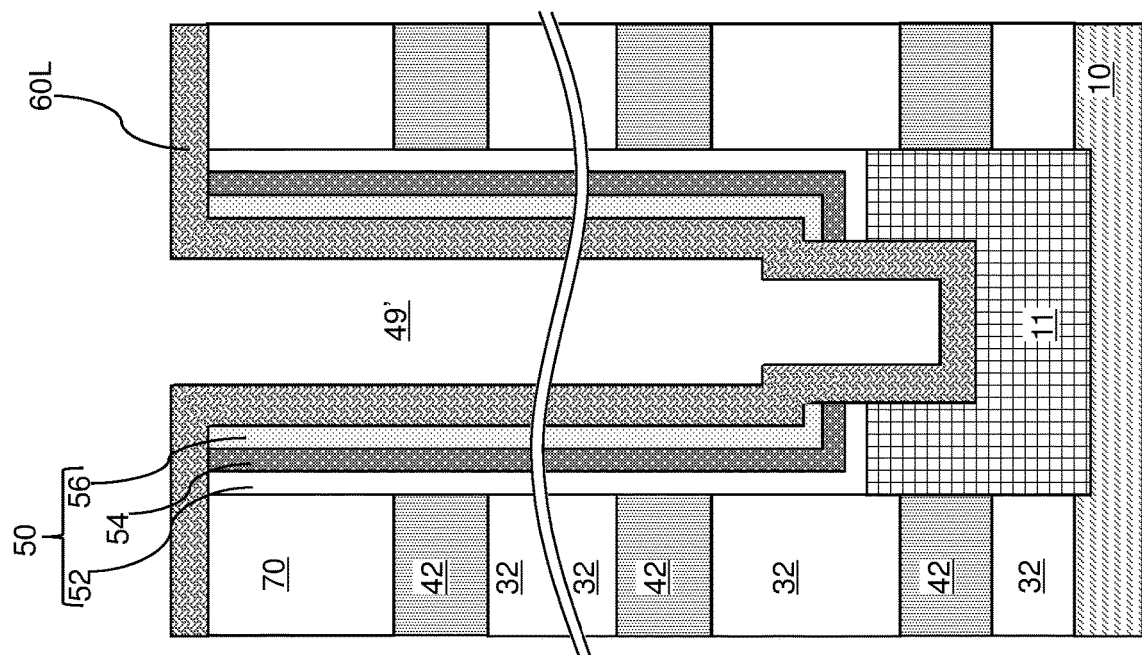

Referring to FIG. 5F, in case the memory cavity 49' in each memory opening is not completely filled by the semiconductor channel layer 60L, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 5G, the horizontal portion of the dielectric core layer 62L can be removed, for example, by a recess etch process such that each remaining portions of the dielectric core layer 62L is located within a respective memory opening 49 and has a respective top surface below the horizontal plane including the top surface of the insulating cap layer 70. Each remaining portion of the dielectric core layer 62L constitutes a dielectric core 62.

Referring to FIG. 5H, a doped semiconductor material having a doping of a second conductivity type can be deposited within each recessed region above the dielectric cores 62. The deposited semiconductor material can have a doping of a second conductivity type that is the opposite of the first conductivity type. For example, if the first conductivity type is p-type, the second conductivity type is n-type, and vice versa. The dopant concentration in the deposited semiconductor material can be in a range from $5.0 \times 10^{18}/cm^3$ to $2.0 \times 10^{21}/cm^3$, although lesser and greater dopant concentrations can also be employed. The doped semiconductor material can be, for example, doped polysilicon.

Excess portions of the deposited semiconductor material having a doping of the second conductivity type and a horizontal portion of the semiconductor channel layer 60L can be removed from above the horizontal plane including the top surface of the insulating cap layer 70, for example, by chemical mechanical planarization (CMP) or a recess etch process. Each remaining portion of the doped semiconductor material having a doping of the second conductivity type constitutes a drain region 63. Each remaining portion of the semiconductor channel layer 60L (which has a doping of the first conductivity type) constitutes a vertical semiconductor channel 60.

A tunneling dielectric layer 56 is surrounded by a memory material layer 54, and laterally surrounds a portion of the vertical semiconductor channel 60. Each adjoining set of a blocking dielectric layer 52, a memory material layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements comprising portions of the memory material layer 54, and an optional blocking dielectric layer 52. Each combination of a pedestal channel portion 11 (if present), a memory stack structure 55, a dielectric core 62, and a drain region 63 within a memory opening 49 is herein referred to as a memory opening fill structure 58. Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure.

Figure 6:
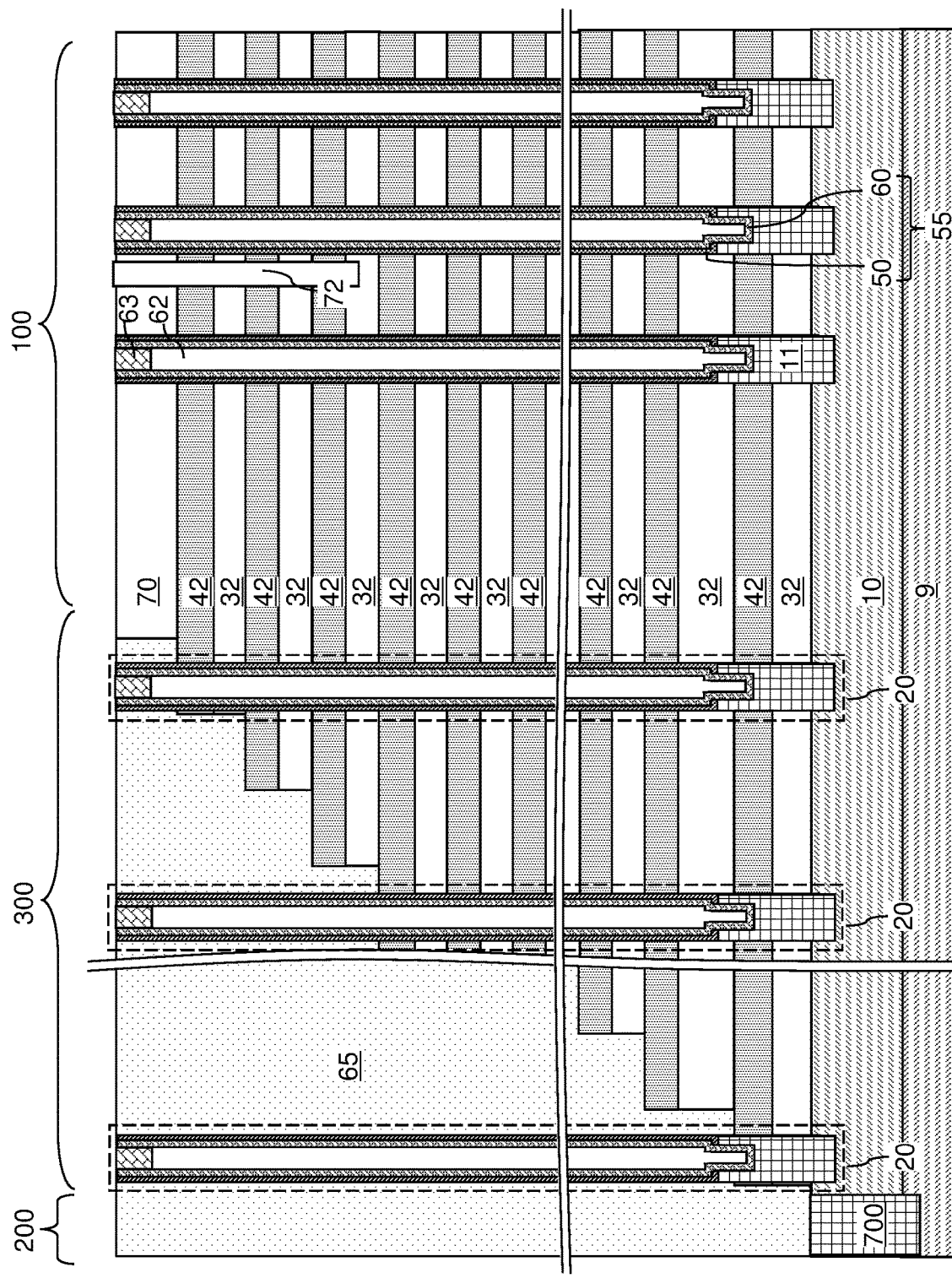
FIG. 6 is a schematic vertical cross-sectional view of the exemplary structure after formation of memory stack structures and support pillar structures according to an embodiment of the present disclosure.

Referring to FIG. 6, the exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B.

Each memory stack structure 55 includes a vertical semiconductor channel 60 and a memory film 50. The memory film 50 may comprise a tunneling dielectric layer 56 laterally surrounding the vertical semiconductor channel 60 and a vertical stack of charge storage regions (comprising portions of the memory material layer 54) laterally surrounding the tunneling dielectric layer 56 and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 7A:
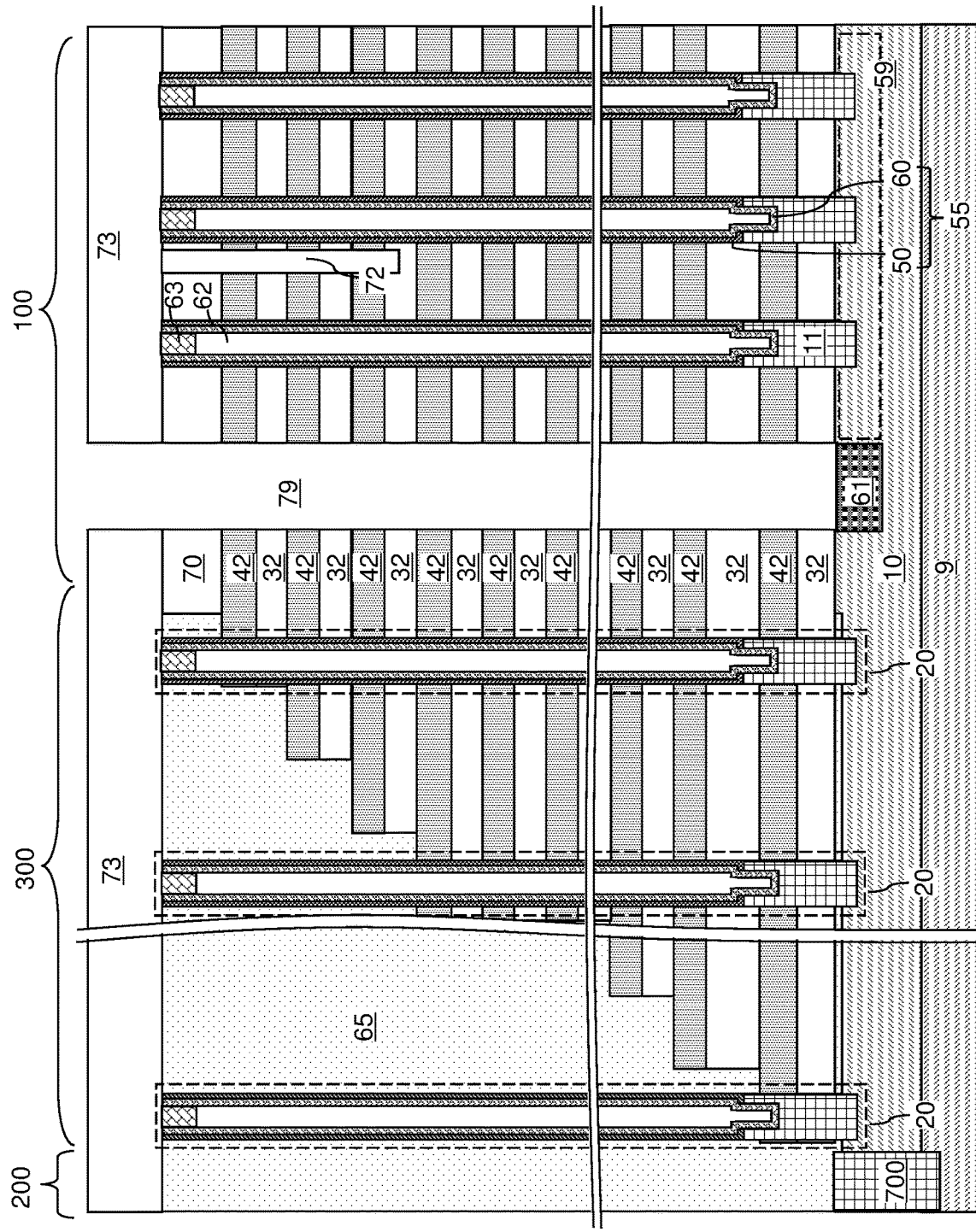
FIG. 7A is a schematic vertical cross-sectional view of the exemplary structure after formation of backside trenches and source regions according to an embodiment of the present disclosure.
Figure 7B:
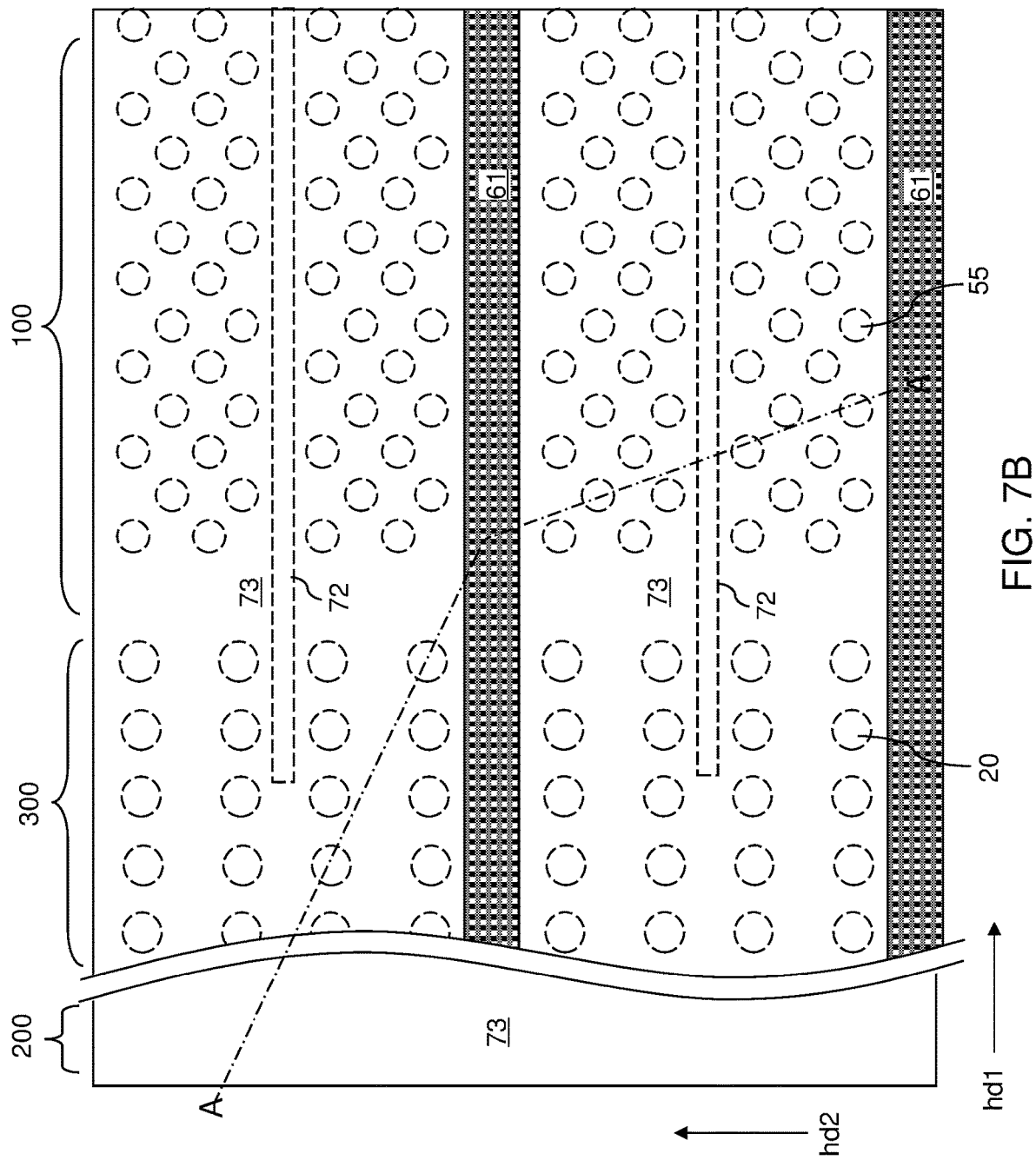
FIG. 7B is a partial see-through top-down view of the exemplary structure of FIG. 7A. The vertical plane A-A' is the plane of the schematic vertical cross-sectional view of FIG. 7A.

Referring to FIGS. 7A and 7B, a contact-level dielectric layer 73 can be formed over the alternating stack (32, 42) of insulating layer 32 and sacrificial material layers 42, and over the memory stack structures 55 and the support pillar structures 20. The contact-level dielectric layer 73 includes a dielectric material that is different from the dielectric material of the sacrificial material layers 42. For example, the contact-level dielectric layer 73 can include silicon oxide. The contact-level dielectric layer 73 can have a thickness in a range from 50 nm to 500 nm, although lesser and greater thicknesses can also be employed.

A photoresist layer (not shown) can be applied over the contact-level dielectric layer 73, and is lithographically patterned to form openings in areas between clusters of memory stack structures 55. The pattern in the photoresist layer can be transferred through the contact-level dielectric layer 73, the alternating stack (32, 42) and/or the retro-stepped dielectric material portion 65 employing an anisotropic etch to form backside trenches 79, which vertically extend from the top surface of the contact-level dielectric layer 73 at least to the top surface of the substrate (9, 10), and laterally extend through the memory array region 100 and the contact region 300.

In one embodiment, the backside trenches 79 can laterally extend along a first horizontal direction hd1 and can be laterally spaced apart from each other along a second horizontal direction hd2 that is perpendicular to the first horizontal direction hd1. The memory stack structures 55 can be arranged in rows that extend along the first horizontal direction hd1. The drain-select-level isolation structures 72 can laterally extend along the first horizontal direction hd1. Each backside trench 79 can have a uniform width that is invariant along the lengthwise direction (i.e., along the first horizontal direction hd1). Each drain-select-level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain-select-level isolation structure 72, or between a neighboring pair of drain-select-level isolation structures 72. In one embodiment, the backside trenches 79 can include a source contact opening in which a source contact via structure can be subsequently formed. The photoresist layer can be removed, for example, by ashing. Generally, backside trenches 79 laterally extending along the first horizontal direction hd1 can be formed through the contact-level dielectric layer 73 and the alternating stack (32, 42). The alternating stack (32, 42) as formed at the processing steps of FIG. 3 is divided into multiple alternating stacks (32, 42) that are laterally spaced apart along the second horizontal direction hd2 by the backside trenches 79. Layer stacks (32, 42, 70, 73) are formed, each of which includes a respective patterned portion of the contact-level dielectric layer 73 and a respective patterned portion of the alternating stack (32, 42) as formed at the processing steps of FIG. 3 and laterally spaced from each other by the backside trenches 79.

Dopants of the second conductivity type can be implanted into physically exposed surface portions of the substrate (9, 10) (which may be surface portions of the semiconductor material layer 10) that are located at the bottom of the backside trenches by an ion implantation process. A source region 61 can be formed at a surface portion of the semiconductor material layer 10 under each backside trench 79. Each source region 61 is formed in a surface portion of the substrate (9, 10) that underlies a respective backside trench 79. Due to the straggle of the implanted dopant atoms during the implantation process and lateral diffusion of the implanted dopant atoms during a subsequent activation anneal process, each source region 61 can have a lateral extent greater than the lateral extent of the lateral extent of the overlying backside trench 79.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. Each horizontal semiconductor channel 59 contacts a source region 61 and a plurality of pedestal channel portions 11.

Figure 8:
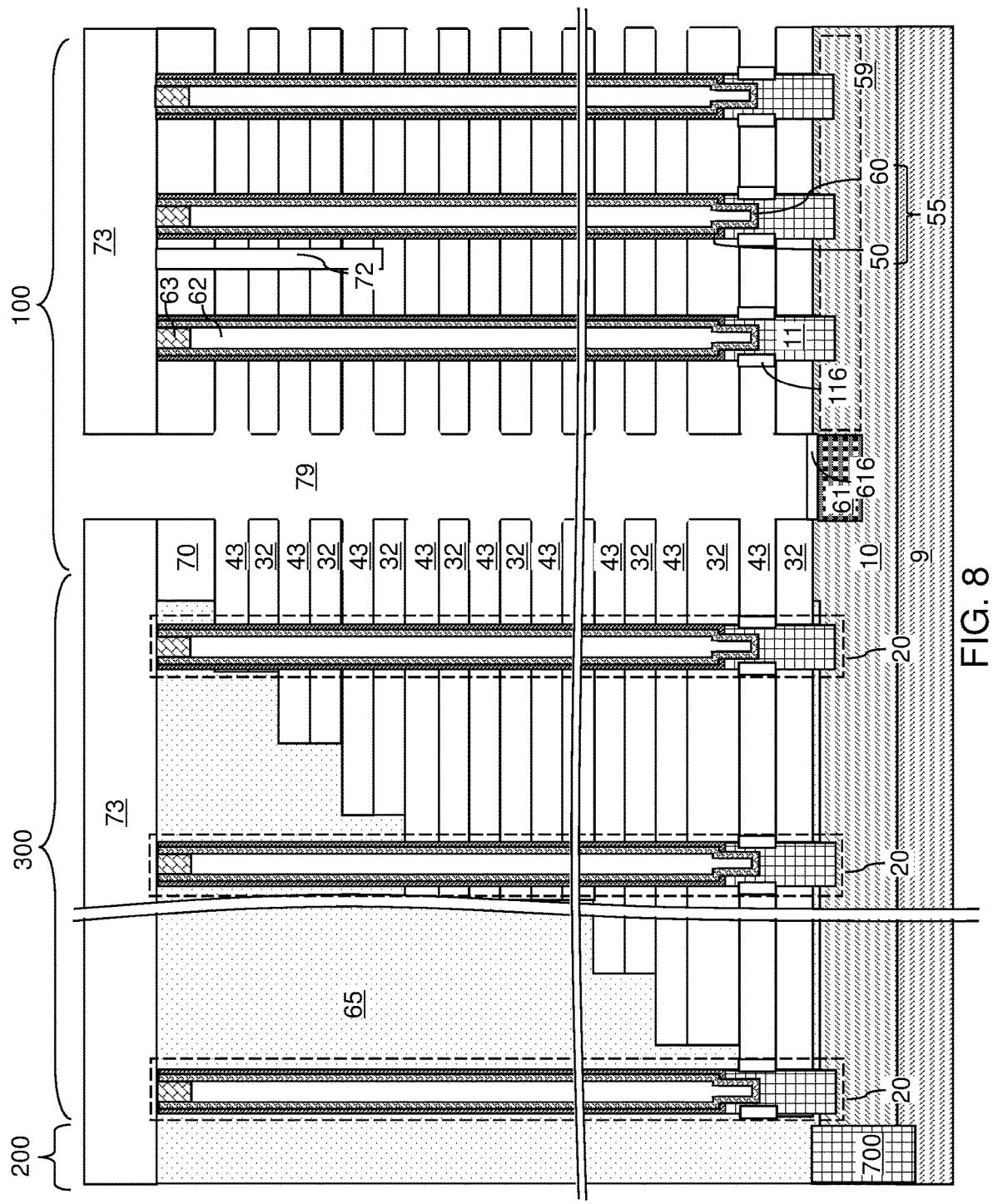
FIG. 8 is a schematic vertical cross-sectional view of the exemplary structure after formation of backside recesses according to an embodiment of the present disclosure.

Referring to FIGS. 8 and 9A, an etchant that selectively etches the second material of the sacrificial material layers 42 with respect to the first material of the insulating layers 32 can be introduced into the backside cavities 79', for example, employing an etch process. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout. Generally, the backside recesses 43 can be formed by removing the sacrificial material layers 42 (which are patterned portions of the sacrificial material layers as formed at the processing steps of FIG. 3) selective to the insulating layers 32 (which are patterned portions of the insulating layers 32 as formed at the processing steps of FIG. 3).

Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Referring to FIG. 9B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Referring to FIG. 9C, at least one conductive material can be deposited in the backside recesses 43 by providing at least one reactant gas into the backside recesses 43 through the backside trenches 79. A metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

Figure 10:
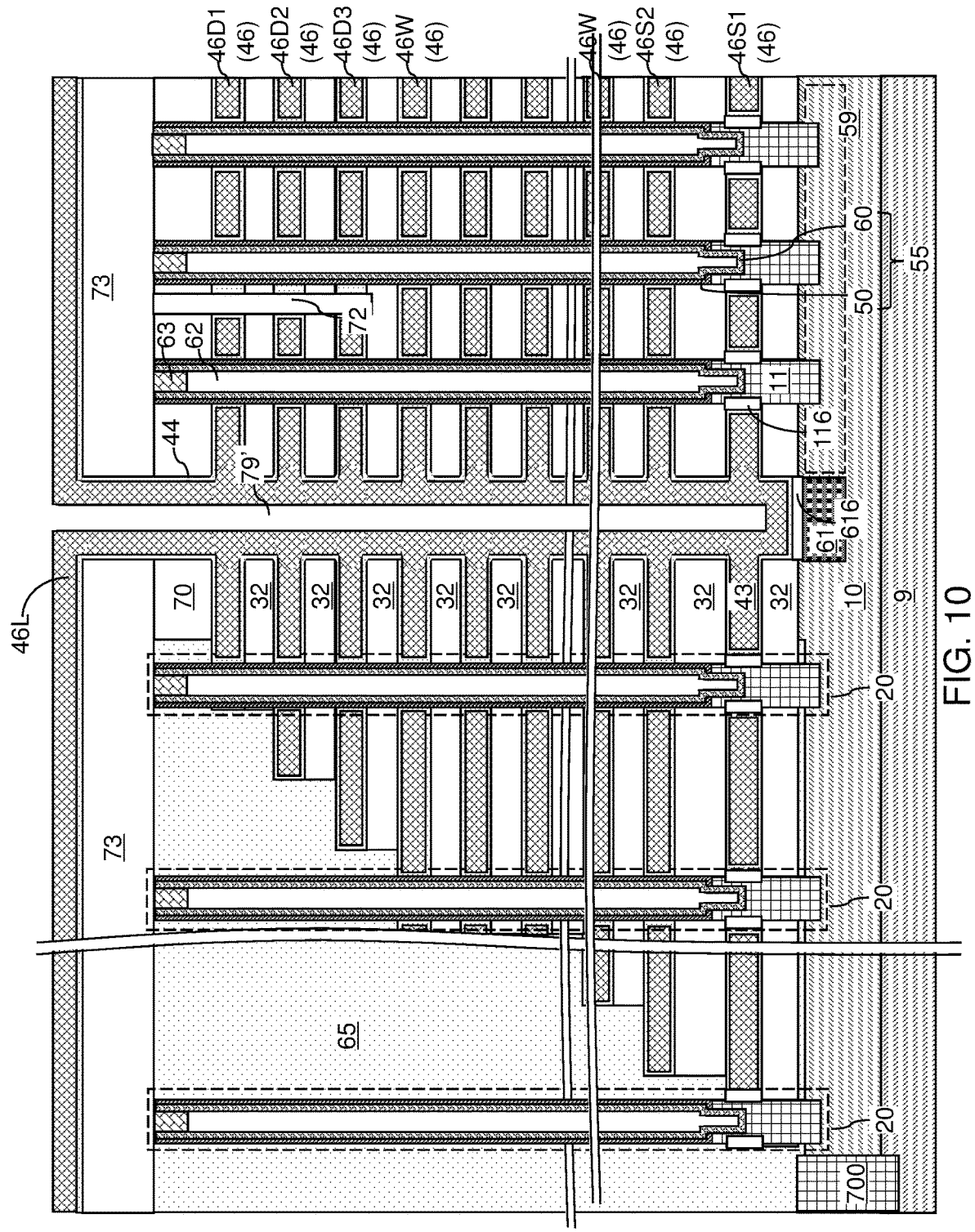
FIG. 10 is a schematic vertical cross-sectional view of the exemplary structure at the processing step of FIG. 9D.

Referring to FIGS. 9D and 10, a metal fill material is deposited in the plurality of backside recesses 43, on the sidewalls of the at least one the backside trench 79, and over the top surface of the contact-level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous metallic material layer 46L can be formed on the sidewalls of each backside trench 79 and over the contact-level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous metallic material layer 46L includes a continuous portion of the metallic barrier layer 46A and a continuous portion of the metallic fill material layer 46B that are located in the backside trenches 79 or above the contact-level dielectric layer 73.

Each sacrificial material layer 42 can be replaced with an electrically conductive layer 46. A backside cavity 79' is present in the portion of each backside trench 79 that is not filled with the backside blocking dielectric layer 44 and the continuous metallic material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46.

The electrically conductive layers 46 include word-line-level electrically conductive layers 46W that function as word lines for vertical NAND strings. Each vertical NAND string includes a respective memory stack structure 55 containing a vertical semiconductor channel 60 and a memory film 50. The electrically conductive layers 46 also include drain-select-level electrically conductive layers (46D1, 46D2, 46D3) that overlie the word-line-level electrically conductive layers 46W. Each drain-select-level electrically conductive layers (46D1, 46D2, 46D3) can be located between a horizontal plane including the top surfaces of the drain-select-level isolation structures 72 and a horizontal plane including the bottom surfaces of the drain-select-level isolation structures 72. A set of drain-selectlevel electrically conductive layers (46D1, 46D2, 46D3) can be laterally spaced from each other by the drain-select-level isolation structures 72 and/or by the backside cavities 79'. The electrically conductive layers 46 also include source-select-level electrically conductive layers (46S1, 46S2) that underlie the word-line-level electrically conductive layers 46W. Each source-select-level electrically conductive layers (46S1, 46S2) can be located between the semiconductor material layer 10 and the word-line-level electrically conductive layers 46W.

In one embodiment, the drain-select-level electrically conductive layers (46D1, 46D2, 46D3) can include first drain-select-level electrically conductive layers 46D1 that are the topmost electrically conductive layers, second drain-select-level electrically conductive layers 46D2 located below the first drain-select-level electrically conductive layers 46D1 relative to the substrate, and optionally third drain-select-level electrically conductive layers 46D3 that are located below the second drain-select-level electrically conductive layers 46D2 relative to the substrate. For example, in an embodiment in which there are a total of three drain-select-level electrically conductive layers (46D1, 46D2, 46D3), the second drain-select-level electrically conductive layers 46D2 are the second topmost electrically conductive layers, i.e., a subset of the electrically conductive layers 46 that are located immediately below the first drain-select-level electrically conductive layers 46D1, and the third drain-select-level electrically conductive layers 46D3 that are the third topmost electrically conductive layers, i.e., a subset of the electrically conductive layers 46 that are located immediately below the second drain-select-level electrically conductive layers 46D2. The drain-select-level electrically conducive layers (46D1, 46D2, 46D3) function as drain-select-level electrodes, i.e., electrodes located at drain select levels and configured to electrically connect or electrically disconnect the vertical semiconductor channels 60 in the vertical NAND strings from the bit lines.

Each electrically conductive layer 46 located at word line levels can function as a combination of a plurality of control gate electrodes located at a same level and a word line electrically interconnecting, i.e., electrically shorting, the plurality of control gate electrodes located at the same level. Such electrically conductive layers 46 are herein referred to as word-line-level electrically conductive layers 46W. The plurality of control gate electrodes within each word-line-level electrically conductive layer 46 are the control gate electrodes for the vertical memory devices including the memory stack structures 55. In other words, each word-line-level electrically conductive layer 46 can be a word line that functions as a common control gate electrode for the plurality of vertical memory devices.

In one embodiment, the source-select-level electrically conductive layers (46S1, 46S2) can include first source-select-level electrically conductive layers 46S1 that are the bottommost electrically conductive layers. The source-select-level electrically conductive layers (46S1, 46S2) can include second source-select-level electrically conductive layers 46S2 that are the second bottommost electrically conductive layers, i.e., a subset of the electrically conductive layers 46 that are located immediately above the first source-select-level electrically conductive layers 46S1. The source-select-level electrically conducive layers (46S1, 46S2) function as source-select-level electrodes, i.e., electrodes located at source select levels and configured to electrically connect or electrically disconnect adjacent portions of vertical semiconductor channels 60 in the vertical NAND strings from the common horizontal source region 59 and/or from a source electrode or local interconnect.

Figure 11A:
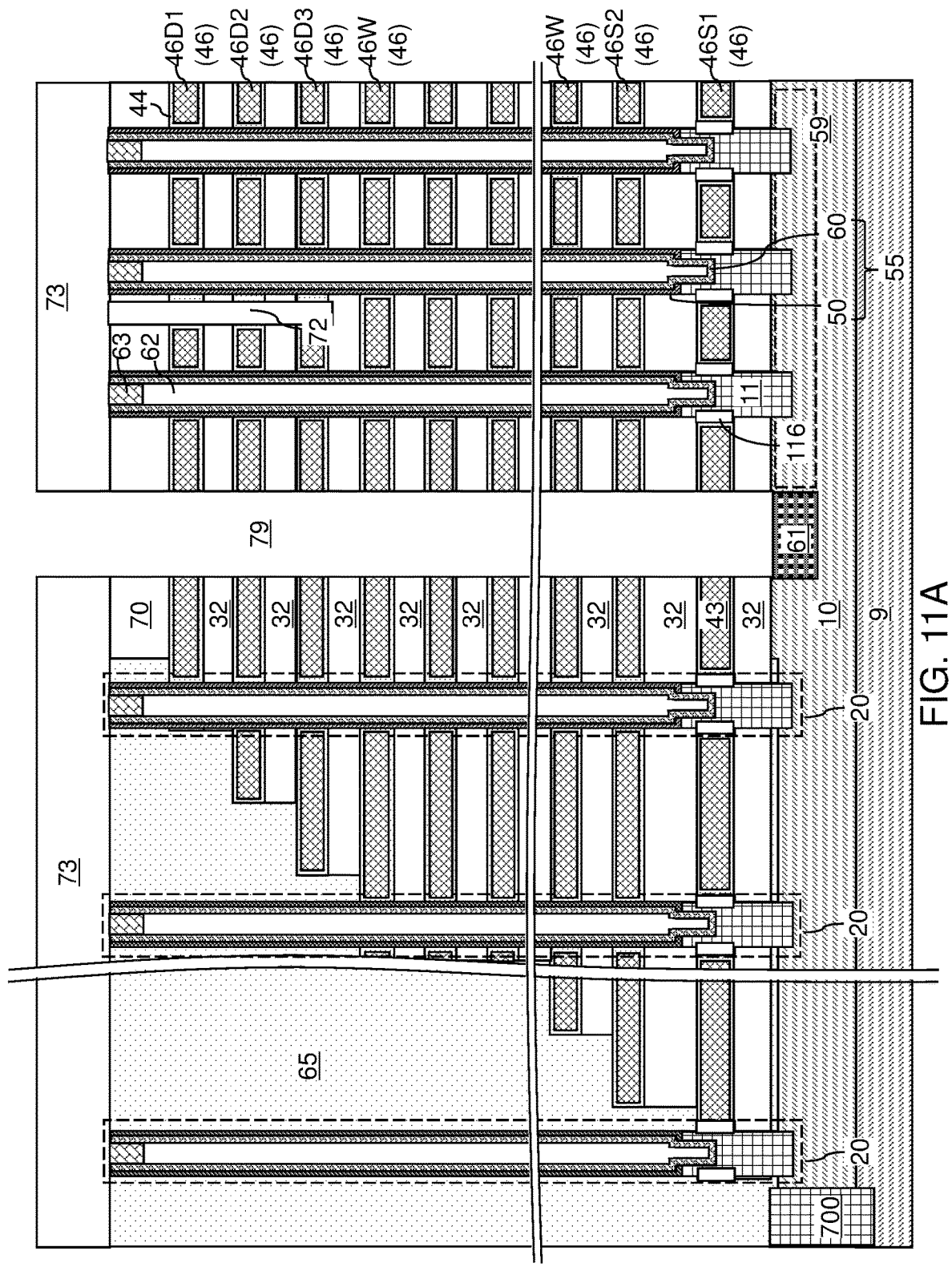
FIG. 11A is a schematic vertical cross-sectional view of the exemplary structure after removal of conductive materials from within the backside trenches according to an embodiment of the present disclosure.
Figure 11B:
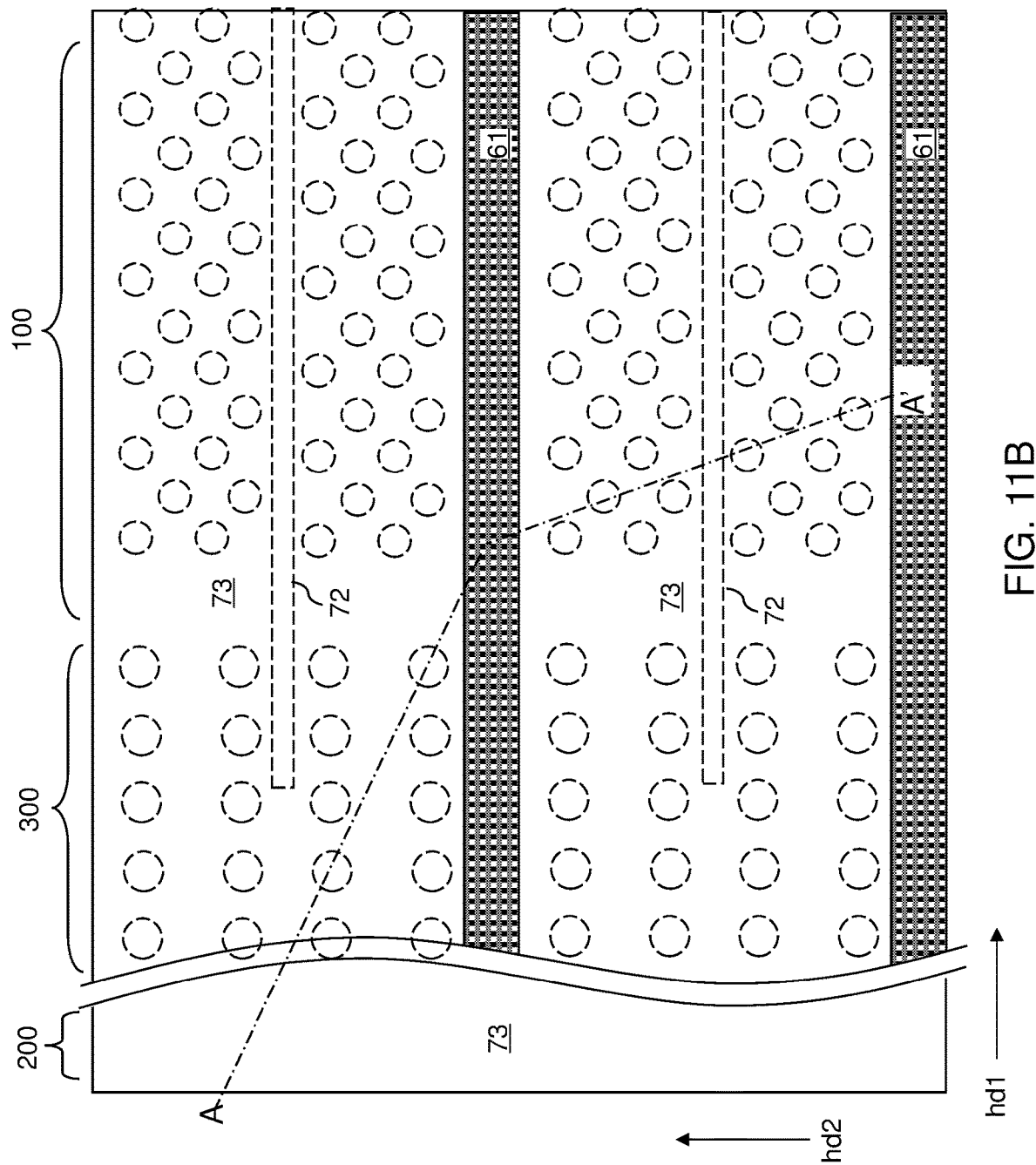
FIG. 11B is a partial see-through top-down view of the exemplary structure of FIG. 11A. The vertical plane A-A' is the plane of the schematic vertical cross-sectional view of FIG. 11A.

Referring to FIGS. 11A and 11B, the deposited metallic material of the continuous metallic material layer 46L is etched back from the sidewalls of each backside trench 79 and from above the contact-level dielectric layer 73 by performing an isotropic etch process that etches the at least one conductive material of the continuous metallic material layer 46L. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

In one embodiment, the removal of the continuous metallic material layer 46L can be selective to the material of the backside blocking dielectric layer 44. In this case, a horizontal portion of the backside blocking dielectric layer 44 can be present at the bottom of each backside trench 79. In another embodiment, the removal of the continuous metallic material layer 46L may not be selective to the material of the backside blocking dielectric layer 44 or, the backside blocking dielectric layer 44 may not be employed. The planar dielectric portions 616 can be removed during removal of the continuous metallic material layer 46L. A backside cavity 79' is present within each backside trench 79. Each backside cavity 79' continuous extends along the first horizontal direction hd1.

Figure 12A:
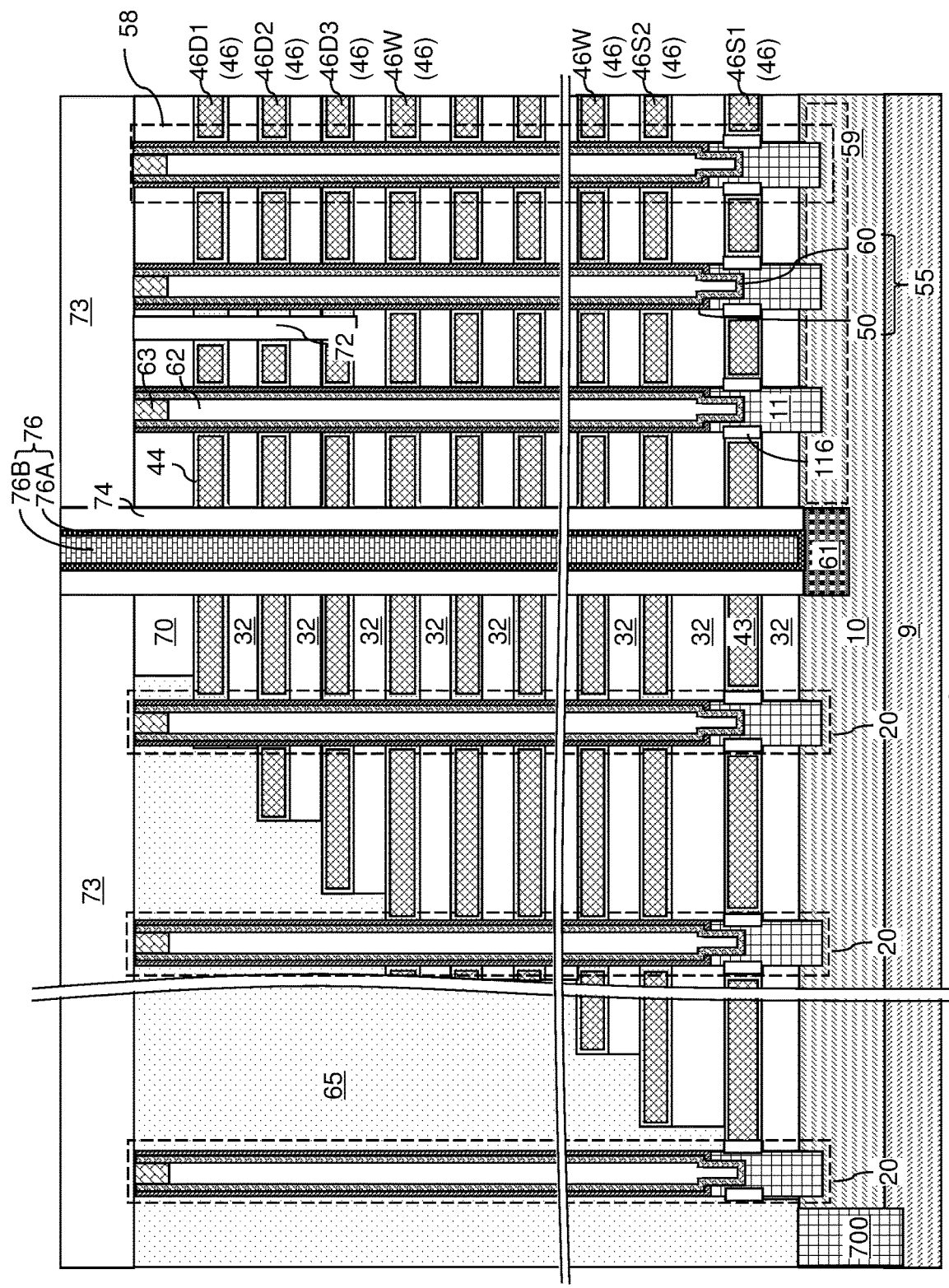
FIG. 12A is a schematic vertical cross-sectional view of the exemplary structure after formation of an insulating spacer with each backside trench according to an embodiment of the present disclosure.
Figure 12B:
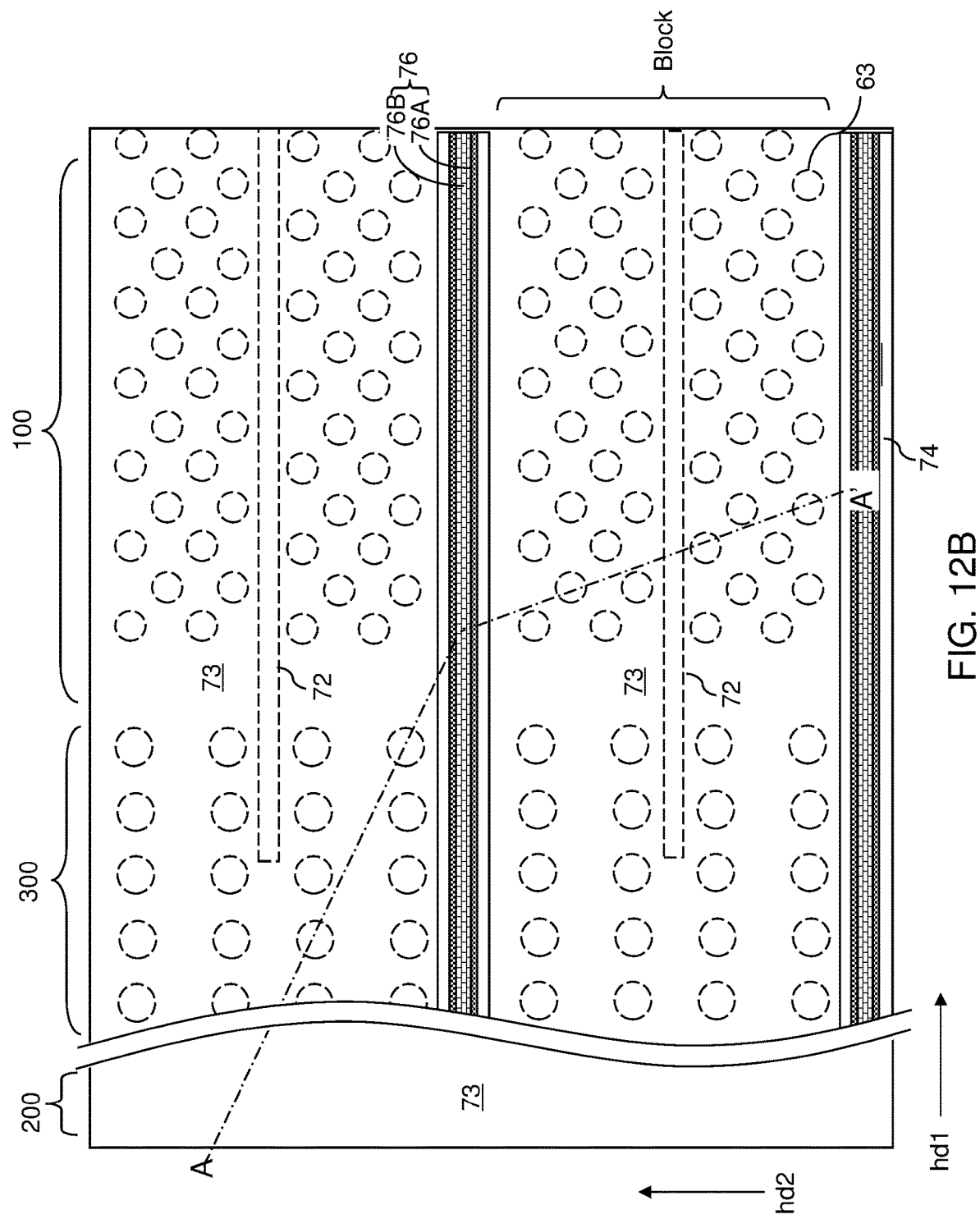
FIG. 12B is a partial see-through top-down view of the exemplary structure of FIG. 12A. The vertical plane A-A' is the plane of the schematic vertical cross-sectional view of FIG. 12A.

Referring to FIGS. 12A and 12B, an insulating material layer can be formed in the backside trenches 79 and over the contact-level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact-level dielectric layer 73 and at the bottom of each backside trench 79. Each remaining portion of the insulating material layer constitutes an insulating spacer 74. A backside cavity 79' is present within a volume surrounded by each insulating spacer 74.

A top surface of a source region 61 can be physically exposed at the bottom of each backside trench 79. A bottommost electrically conductive layer 46 provided upon formation of the electrically conductive layers 46 within the alternating stack (32, 46) can comprise a select gate electrode for the field effect transistors. Each source region 61 is formed in an upper portion of the substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure (i.e., source line or source local interconnect) 76 can be formed within each backside cavity 79'. Each contact via structure 76 can fill a respective cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact-level dielectric layer 73 overlying the alternating stack (32, 46) as a stopping layer. If chemical mechanical planarization (CMP) process is employed, the contact-level dielectric layer 73 can be employed as a CMP stopping layer. Each remaining continuous portion of the at least one conductive material in the backside trenches 79 constitutes a backside contact via structure 76. Each backside contact via structure 76 extends through the alternating stacks (32, 46), and contacts a top surface of a respective source region 61. If a backside blocking dielectric layer 44 is employed, each backside contact via structure 76 can contact a sidewall of the backside blocking dielectric layer 44.

Generally, a backside contact via structure 76 can be formed within each of the backside trenches 79 after formation of the insulating spacers 74 by depositing and planarizing at least one conductive material in volumes of the backside trenches 79 that are not filled with the insulating spacers 74.

Alternatively, the above described insulating material layer can be formed in the backside trenches 79 to completely fill the entire volume of a backside trench 79 and may consist essentially of at least one dielectric material. In this alternative embodiment, the source region 61 and the backside trench via structure 76 may be omitted, and a horizontal source line (e.g., direct strap contact) may contact an side of the lower portion of the semiconductor channel 60.

The combination of the memory film 50, the vertical semiconductor channel 60 the drain region 63 and portions of the electrically conductive layers 46 located adjacent to the memory film 50 constitute a vertical NAND string 58. The area between adjacent backside trenches 79 may be a memory block. Thus, each vertical NAND string 58 located in the memory block is connected to the same horizontal channel region 59 and/or to the same horizontal source line, which is used to apply an erase voltage to erase all vertical NAND strings in the memory block.

Figure 13A:
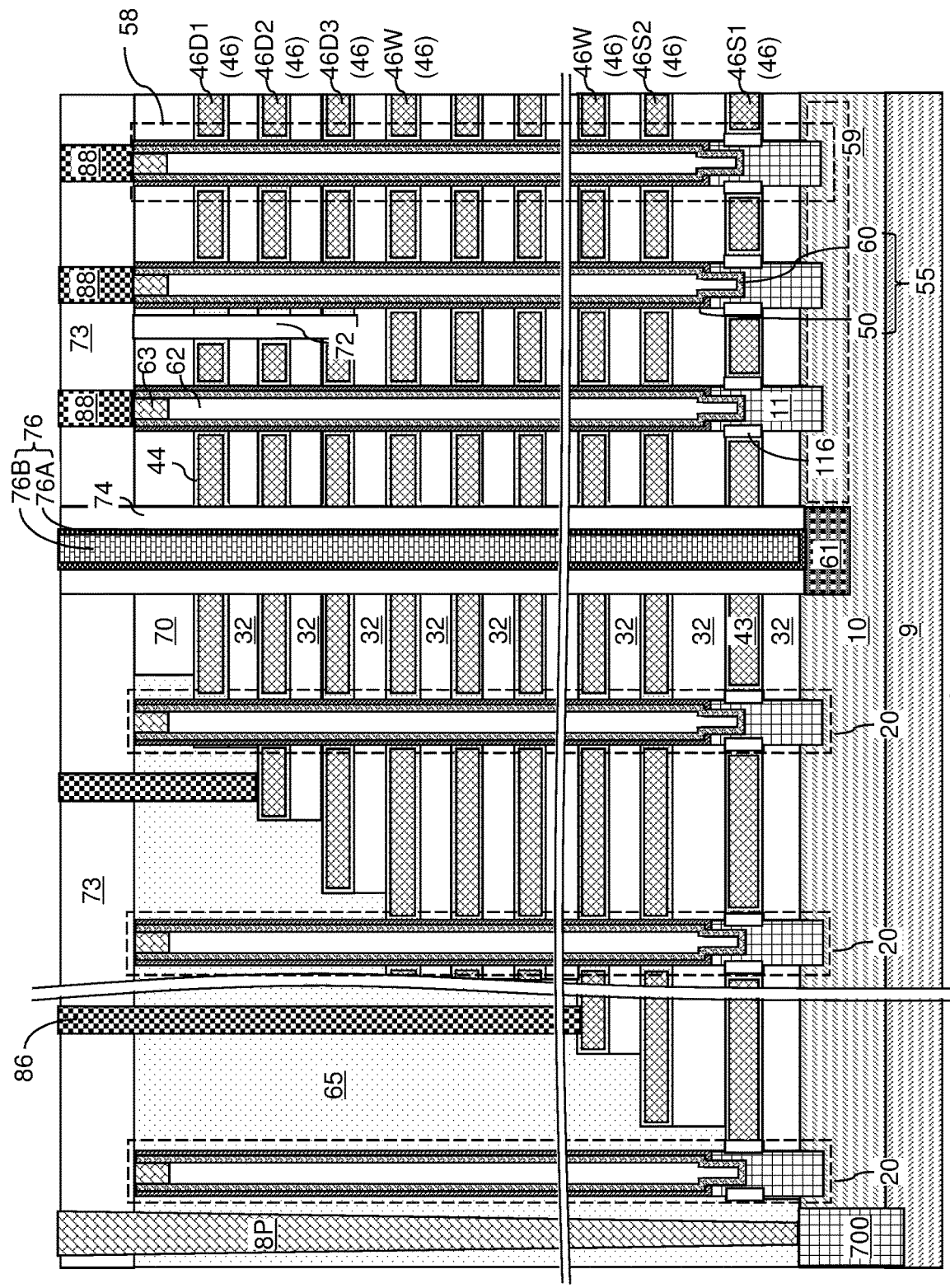
FIG. 13A is a schematic vertical cross-sectional view of the exemplary structure after formation of a backside contact via structure with each backside trench according to an embodiment of the present disclosure.
Figure 13B:
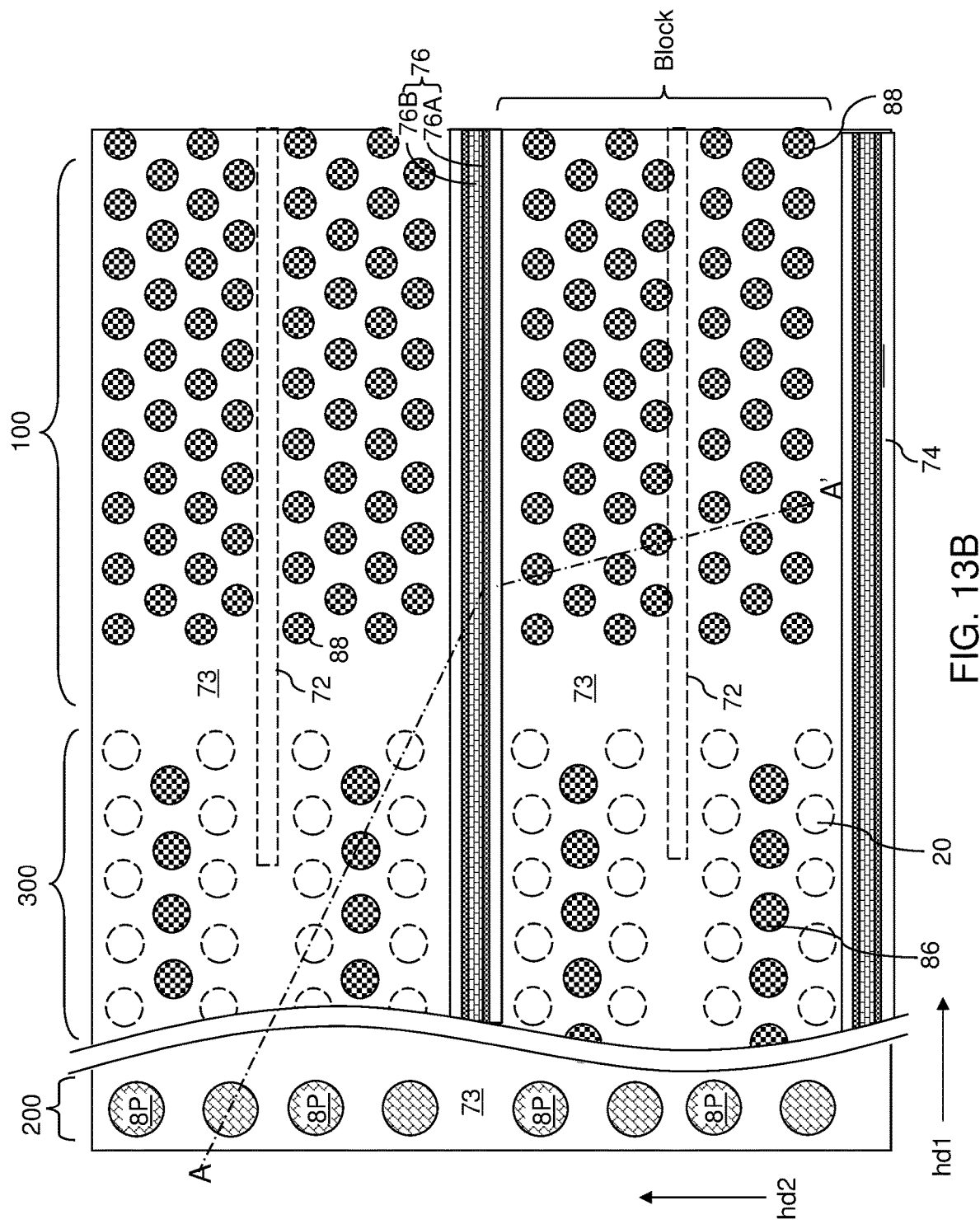
FIG. 13B is a partial see-through top-down view of the exemplary structure of FIG. 13A. The vertical plane A-A' is the plane of the schematic vertical cross-sectional view of FIG. 13A.

Referring to FIGS. 13A and 13B, additional contact via structures (88, 86, 8P) can be formed through the contact-level dielectric layer 73, and optionally through the retro-stepped dielectric material portion 65. For example, drain contact via structures 88 can be formed through the contact-level dielectric layer 73 on each drain region 63. Word line contact via structures 86 can be formed on the electrically conductive layers 46 through the contact-level dielectric layer 73, and through the retro-stepped dielectric material portion 65. Peripheral device contact via structures 8P can be formed through the retro-stepped dielectric material portion 65 directly on respective nodes of the peripheral devices (if present on the same substrate and the memory device).

Figure 14A:
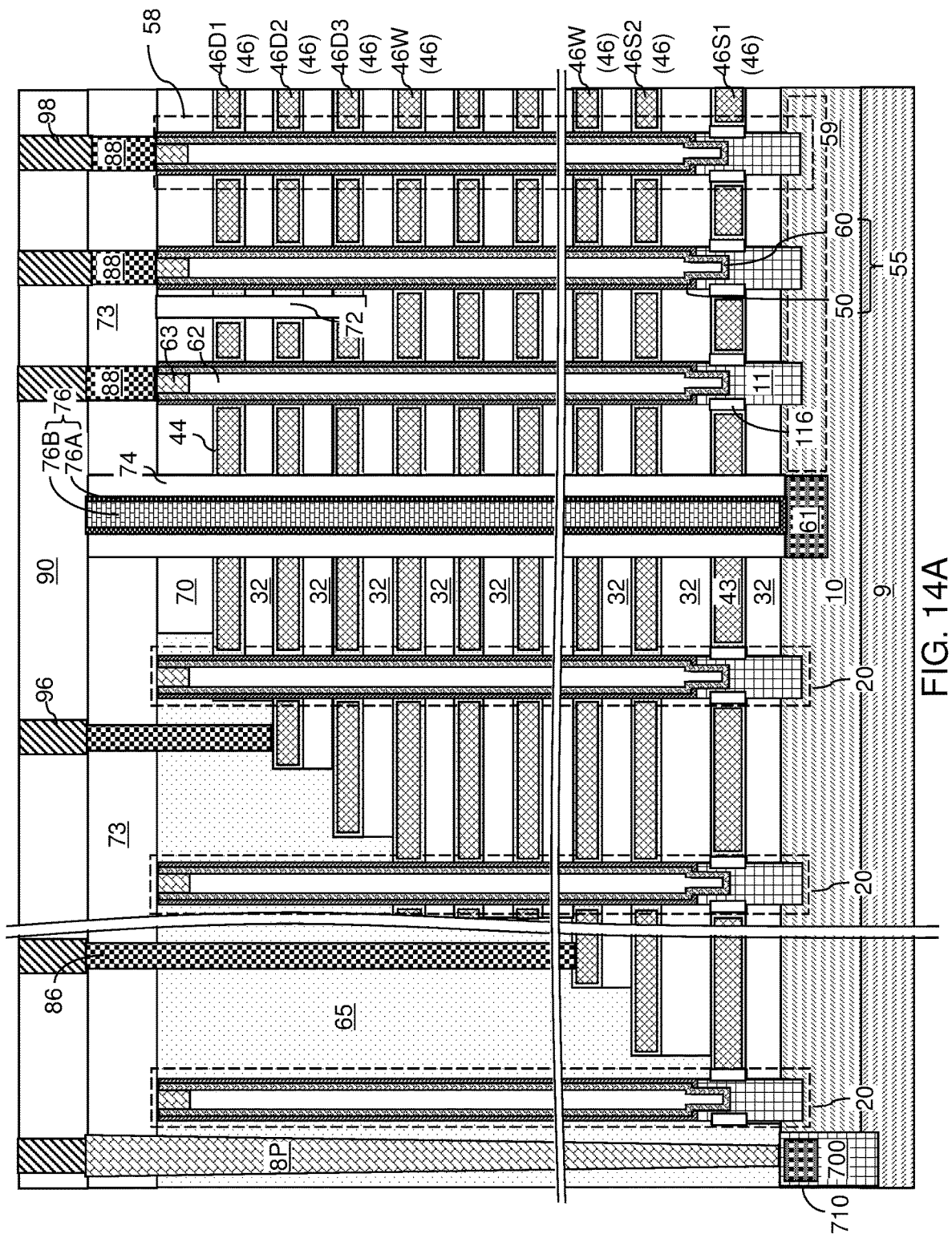
FIG. 14A is a schematic vertical cross-sectional view of the exemplary structure after formation of a bit-line-level dielectric layer and bit-line-level metal interconnect structures according to an embodiment of the present disclosure.

Referring to FIGS. 14A and 14B, a bit-line-level dielectric layer 90 can be formed over the contact-level dielectric layer 73, and bit-line-level metal interconnect structures (98, 96) can be formed in the bit-line-level dielectric layer 90. The bit-line-level metal interconnect structures (98, 96) can include bit lines 98 that are electrically connected to a respective substrate of the drain regions 63, and interconnection metal lines 96 that are electrically connected to the electrically conductive layers 46. The bit lines 98 can laterally extend along the second horizontal direction hd2. Each of the bit lines 98 can be electrically connected to a single drain region 63 per memory block that can be selected by a vertical stack of a first drain-select-level electrically conductive layer 46D1, a second drain-select-level electrically conductive layer 46D2, and optionally a third drain-select-level electrically conductive layer 46D3. Each block includes a respective set of vertical NAND strings 58 that are laterally surrounded by a respective vertical stack of a first drain-select-level electrically conductive layer 46D1, a second drain-select-level electrically conductive layer 46D2, and a third drain-select-level electrically conductive layer 46D3.

Figure 15:
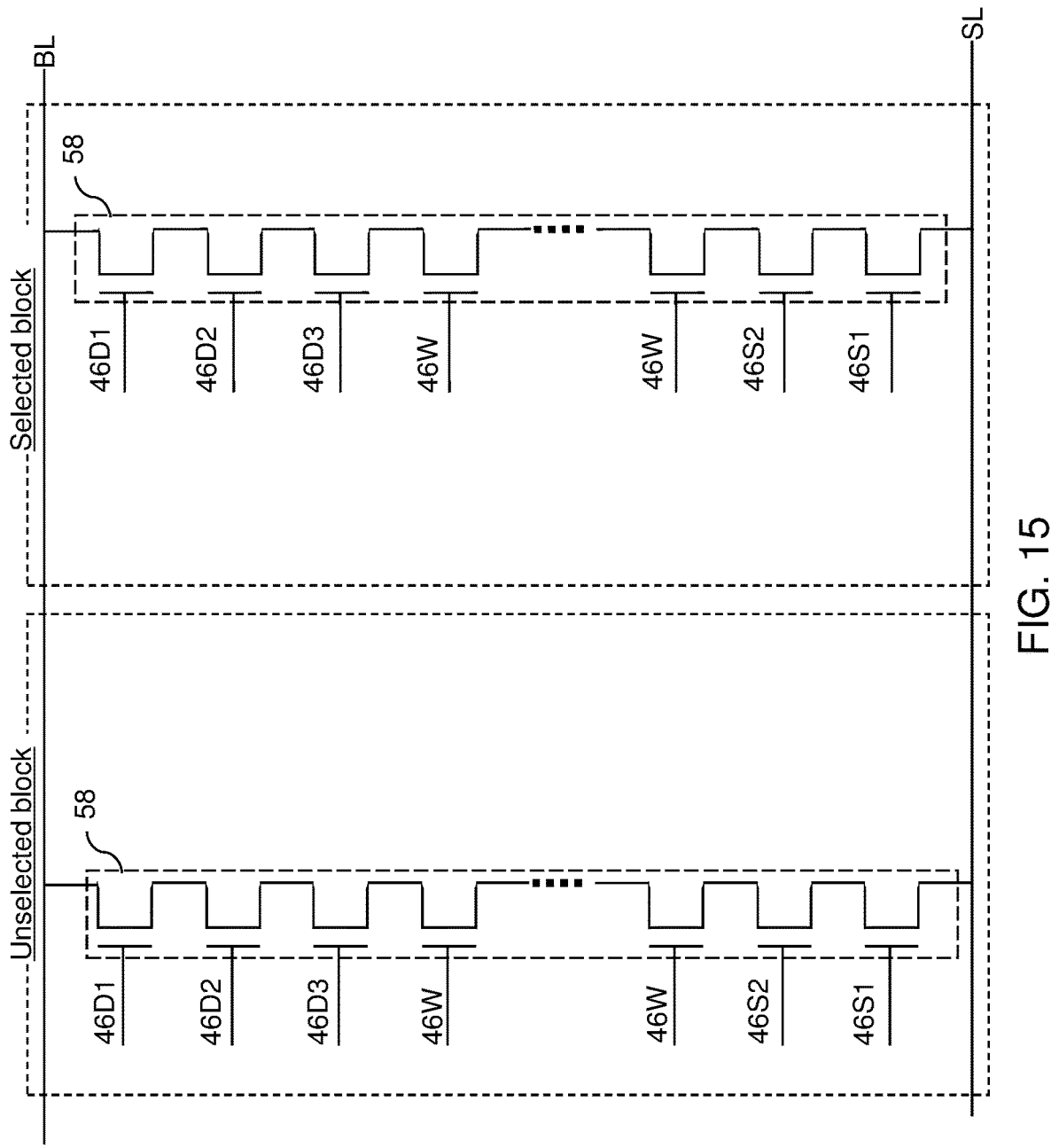
FIG. 15 is a circuit schematic of two vertical NAND strings located in an unselected block and in a selected block within the exemplary structure of FIGS. 13A and 13B according to an aspect of the present disclosure.

Referring to FIG. 15, a circuit schematic of two vertical NAND strings 58 is illustrated, which can be located in an unselected block and in a selected block within the exemplary structure of FIGS. 14A and 14B according to an aspect of the present disclosure. Each vertical NAND string 58 can include electrically conductive layers 46, which include source-select-level electrically conductive layers (46S1, 46S2), word-line-level electrically conductive layers 46W, and drain-select-level electrically conductive layers (46D1, 46D2, 46D3).

Referring to FIGS. 1-15 and according to an aspect of the present disclosure, a three-dimensional memory comprises an alternating stack of insulating layers 32 and electrically conductive layers 46 located over a substrate 9. The electrically conductive layers 46 comprise word-line-level electrically conductive layers 46W, first drain-select-level electrically conductive layers 46D1 overlying the word-line-level electrically conductive layers 46W, located at a first drain select level, and laterally spaced apart from each other, and second drain-select-level electrically conductive layers (e.g., 46D3 in FIGS. 14A and 15 and 46D2 in FIGS. 16 and 17) located at a second drain select level between the first drain-select-level electrically conductive layers 46D1 and the word-line-level electrically conductive layers 46W, and laterally spaced apart from each other. The memory device also includes blocks of vertical NAND strings 58 that vertically extend through the alternating stack (32, 46), wherein each of the vertical NAND strings comprises a respective vertical semiconductor channel 60, a drain region 63 located at an upper end of the respective vertical semiconductor channel, and a respective vertical stack of memory elements (such as portions of charge storage layers 54 of the memory films 50) located at levels of the word-line-level electrically conductive layers 46W.

The memory device also includes a source line electrically connected to lower ends of the vertical semiconductor channels 60. The source line may comprise a semiconductor material layer 10 located between the substrate 9 and the lower end of the vertical semiconductor channels 60. The source line may also include the backside contact via structure 76 in addition to or separate from the semiconductor material layer 10. Alternatively, the source line may comprise a horizontal direct strap contact or a horizontal electrically conductive layer. The memory device also includes bit lines 98 overlying the vertical NAND strings 58 and electrically connected to a respective subset of the drain regions 64.

The memory device also includes an erase operation bias circuit 710 which is a portion of the peripheral circuit 700. The erase operation bias circuit 710 is configured to control operation of the blocks of vertical NAND strings, wherein the erase operation bias circuit is configured to erase the vertical NAND strings in a selected block by applying a relatively high erase voltage (which may be in a range from 15 V to 45 V) to the source line; applying a relatively low voltage (i.e., which is lower than the erase voltage) or 0 V to the bit lines 98, applying a first drain-select-level voltage that is less than the erase voltage (which may be, for example, in a range from 0 V to 10 V and which may or may not be 0 V) to one of the first drain-select-level electrically conductive layers 46D1 located within a selected block, and applying a second drain-select-level voltage (which may be in a range from 10 V to 45 V) that is greater than the first drain-select-level voltage and not greater than the erase voltage to one of the second drain-select-level electrically conductive layers 46D3 located within the selected block. The erase operation may comprise a gate induced drain leakage (GIDL) type erase operation.

In one embodiment, the electrically conductive layers 46 further comprise third drain-select-level electrically conductive layers (e.g., 46D2) located at a third drain select level between the second drain-select-level electrically conductive layers 46D3 and the word-line-level electrically conductive layers 46W, and laterally spaced apart from each other. The erase operation bias circuit 710 is configured to apply a third drain-select-level voltage to the third drain-select-level electrically conductive layers 46D2. The third drain-select-level voltage (which may be in a range from 5 V to 15 V, such as 8V to 10V) is greater than the first drain-select-level voltage and less than the second drain-select-level voltage.

In one embodiment, the second drain-select-level voltage is the same as the erase voltage. In one embodiment, the first drain-select-level voltage is 0 V. In one embodiment, the third drain-select-level voltage is in a range from 25% to 75% of the erase voltage.

In one embodiment, the erase operation bias circuit 710 is configured to maintain each of the word-line-level electrically conductive layers 46W electrically floating, or to apply a word line voltage having a magnitude less than 10% of a magnitude of the erase voltage (such as a voltage in a range from 0 V and 4.5 V, e.g., 0.5 V to 1 V), during the erase operation.

In one embodiment, the erase operation bias circuit 710 is configured to apply 0 V to each of the first drain-select-level electrically conductive layers 46D1 that are located within unselected blocks, and is configured to apply 0 V to each of the second drain-select-level electrically conductive layers 46D3 that are located within the unselected blocks. In one embodiment, the erase operation bias circuit is configured to apply 0 V to each of the third drain-select-level electrically conductive layers 46D3 that are located within unselected blocks. In one embodiment, the erase operation bias circuit is configured to apply 0 V to each of the third drain-select-level electrically conductive layers 46D2 that are located within unselected blocks.

In one embodiment, the electrically conductive layers 46 comprise: first source select-level electrically conductive layers 46S1 underlying the word-line-level electrically conductive layers 46, located at a first source select level, and laterally spaced apart from each other; and second source-select-level electrically conductive layers 46S2 located at a second source select level between the first source-select-level electrically conductive layers 46S1 and the word-line-level electrically conductive layers 46W, and laterally spaced apart from each other.

In one embodiment, the erase operation bias circuit is configured to apply a first source-select-level voltage that is less than the erase voltage (such as a voltage that is less than the erase voltage, such as less than the erase voltage by 8V to 10V) to one of the first source-select-level electrically conductive layers 46S1 located within the selected block, and to apply a second source-select-level voltage that is greater than the first source-select-level voltage and not greater than the erase voltage (such as a voltage that is less than the erase voltage by 6V to 8V) to one of the second second-select-level electrically conductive layers 46S2 located within the selected block during the erase operation.

In one embodiment, the erase operation bias circuit 710 is configured to apply the erase voltage to each of the first source-select-level electrically conductive layers 46S1 and each of the second second-select-level electrically conductive layers 46S2 that are located within unselected blocks during the erase operation.

Figure 16:
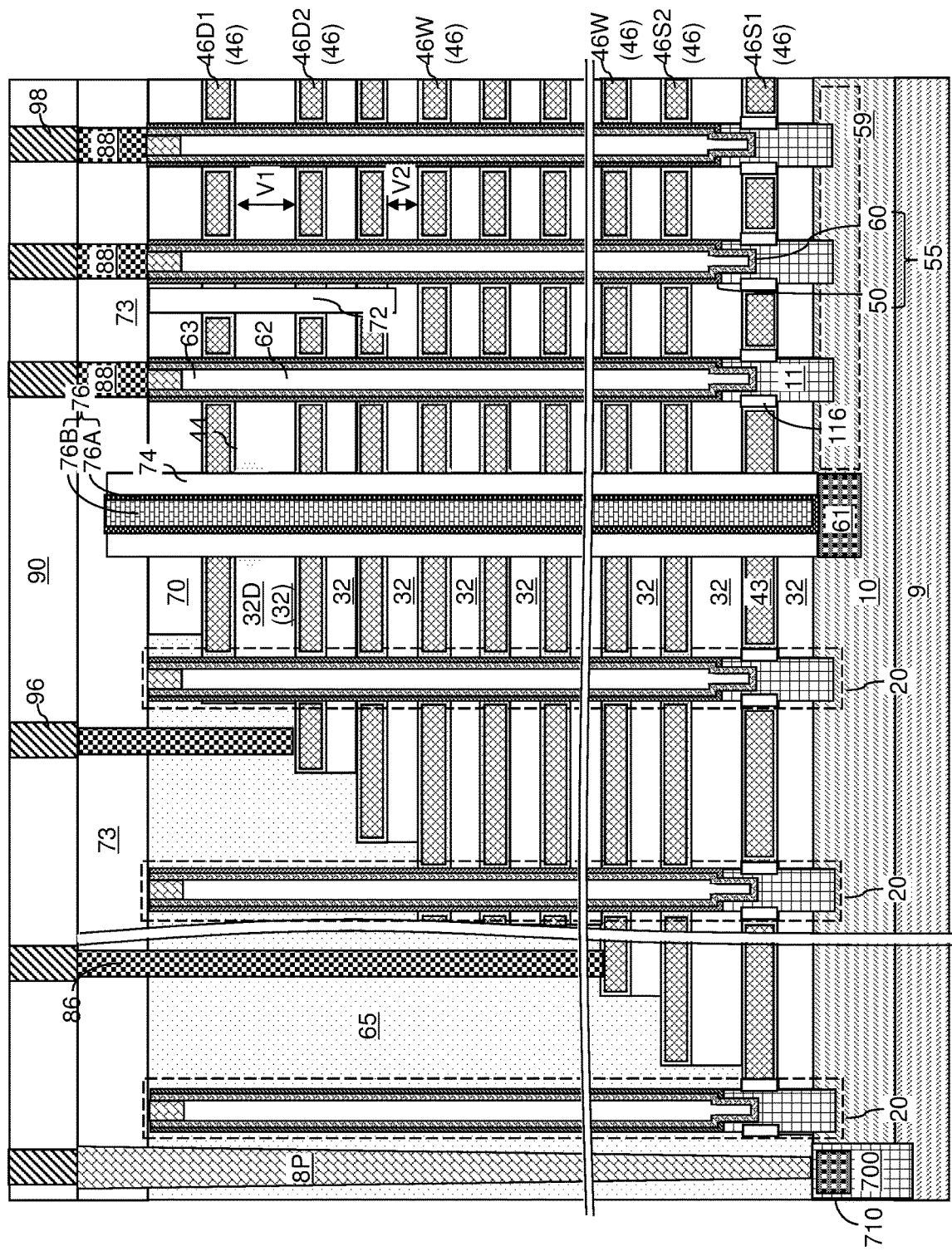
FIG. 16 is a schematic vertical cross-sectional view of an alternative configuration of the exemplary structure according to an embodiment of the present disclosure.

Referring to FIG. 16, an alternative configuration of the exemplary structure according to an embodiment of the present disclosure is illustrated. In this case, at least two drain-select-level electrically conductive layers (46D1, 46D2) may be provided. The vertical distance V1 between the first drain-select-level electrically conductive layers 46D1 and the second drain-select-level electrically conductive layers 46D2 can be greater than the maximum vertical distance (i.e., spacing) V2 between vertically neighboring pairs of word-line-level electrically conductive layers 46W. In one embodiment, the ratio between the vertical distance V1 between the first drain-select-level electrically conductive layers 46D1 and the second drain-select-level electrically conductive layers 46D2 to the maximum spacing V2 between vertically neighboring pairs of word-line-level electrically conductive layers 46W can be in a range from 1.1 to 6.0.

Figure 17:
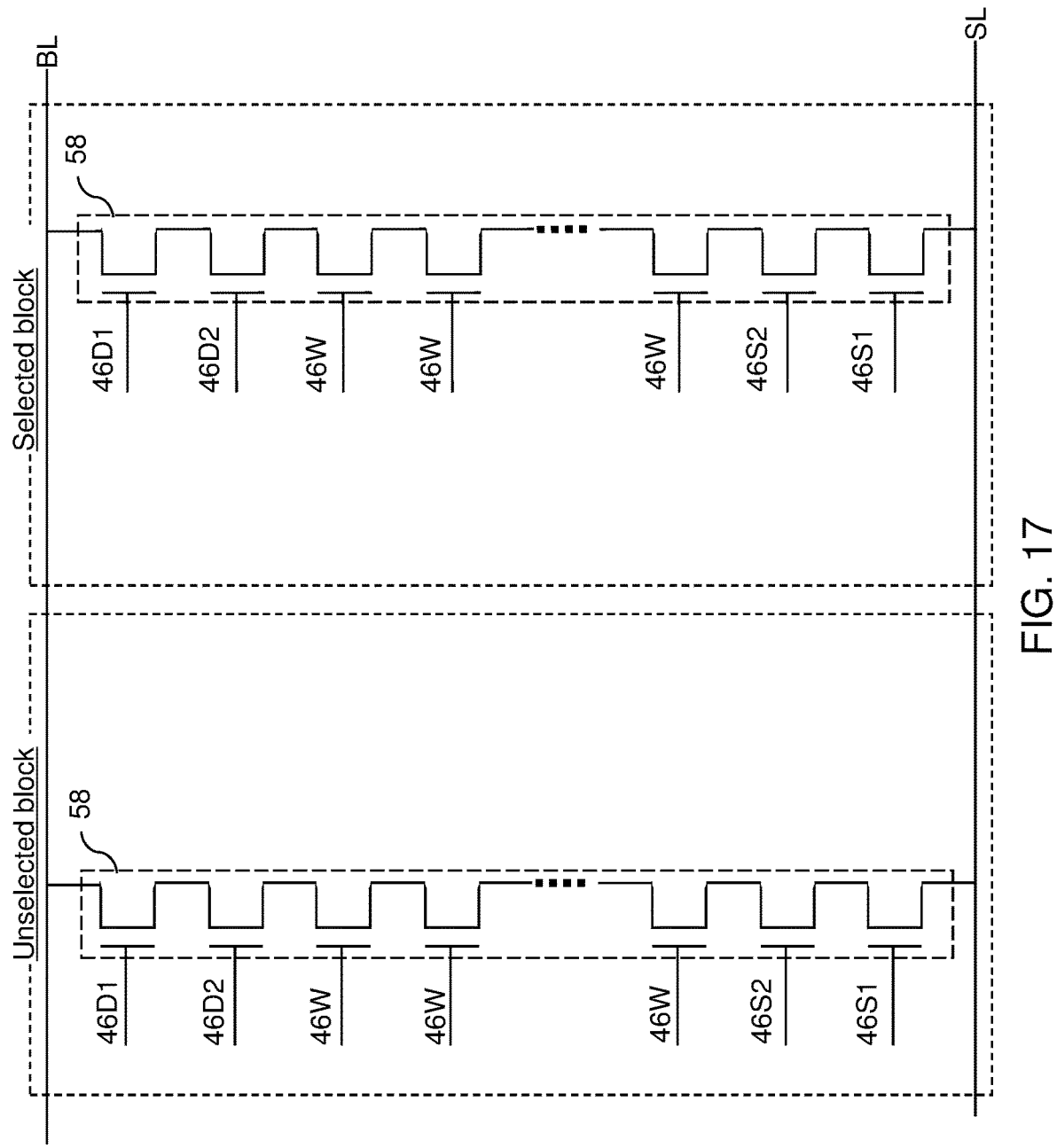
FIG. 17 is a circuit schematic of two vertical NAND strings located in an unselected block and in a selected block within the alternative configuration of the exemplary structure of FIG. 16 according to an aspect of the present disclosure.

Referring to FIG. 17, a circuit schematic of two vertical NAND strings is illustrated, which can be located in an unselected block and in a selected block within the exemplary structure of FIG. 16 according to an aspect of the present disclosure. Each vertical NAND string can include electrically conductive layers 46, which include source-select-level electrically conductive layers (46S1, 46S2), word-line-level electrically conductive layers 46W, and drain-select-level electrically conductive layers (46D1, 46D2).

In one embodiment, the second drain-select-level voltage may be the same as the erase voltage. In one embodiment, the first drain-select-level voltage is 0 V.

Figure 18:
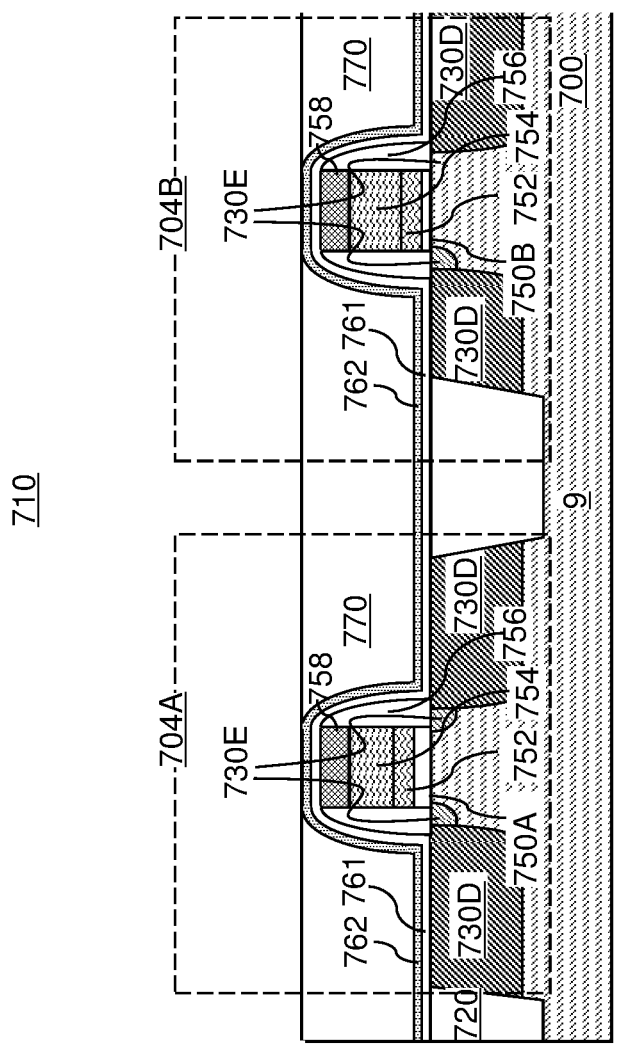
FIG. 18 is a schematic vertical cross-sectional view of a first configuration of a drain-select-level bias transistor and a bit line bias transistor in a peripheral circuit according to an aspect of the present disclosure.

FIG. 18 illustrates a portion of the erase operation bias circuit 710 which includes a drain-select-level bias transistor 704A and a bit line bias transistor 704B. The drain-select-level bias transistor 704A can be electrically connected to one of the drain-select-level electrically conductive layers (46D1, 46D2, 46D3) such as a second drain-select-level electrically conductive layer 46D2 or a third drain-select-level electrically conductive layer 46D3. The bit line bias transistor 704B can be electrically connected to a respective one of the bit lines 98. The drain-select-level bias transistor 704A can be configured to switch a higher voltage than the bit line bias transistor 704B, since the relatively high erase voltage is not applied to the bit lines. In one embodiment, the thickness of a gate dielectric 750A for the drain-select-level bias transistor 704A can be greater than the thickness of a gate dielectric 750B of the bit line bias transistor 704B. Generally, the bit line bias transistor 704B may be configured to electrically ground a bit lines 98 (i.e., to transfer 0 V across the bit line bias transistor 704B), and the drain-select-level bias transistor 704A can be configured to transfer a higher voltage (such as an erase voltage) to one of the drain-select-level electrically conductive layers (46D1, 46D2, 46D3).

In one embodiment, each of the source region and the drain region of the drain-select-level bias transistor 704A may include a deep source/drain region 730D and a source/drain extension region 730E having a lesser depth and a lower dopant concentration than the deep source/drain region 730D in order to withstand high voltage operations (such as operations at voltages in a range from 15 V to 45 V). In one embodiment, one or both of the source region and the drain region of the bit line bias transistor 704B may consist of a respective deep source/drain region 730D. In other words, a source/drain extension region 730E having a lesser depth and a lower dopant concentration than the deep source/drain region 730D may not be employed in the source region and/or in the drain region of the bit line bias transistor 704B. Such an omission is possible because the bit line bias transistor 704B in the erase operation bias circuit within a peripheral circuit 700 transfers 0 V when turned on, i.e., is employed for a low voltage operation. The transistors 704A, 704B may be part of respective CMOS devices, which are not shown for clarity.

The low voltage bit line bias transistor 704B may have a smaller footprint than a footprint of a high voltage transistor 704A. Only one high voltage source line bias transistor may be used for an entire memory plane containing the memory blocks. Since there are many bit line bias transistors 704B in the peripheral circuit 700, the footprint of the peripheral circuit 710 containing one large footprint source line bias transistor and many smaller bit line bias transistors 704B may be reduced.

Figure 19:
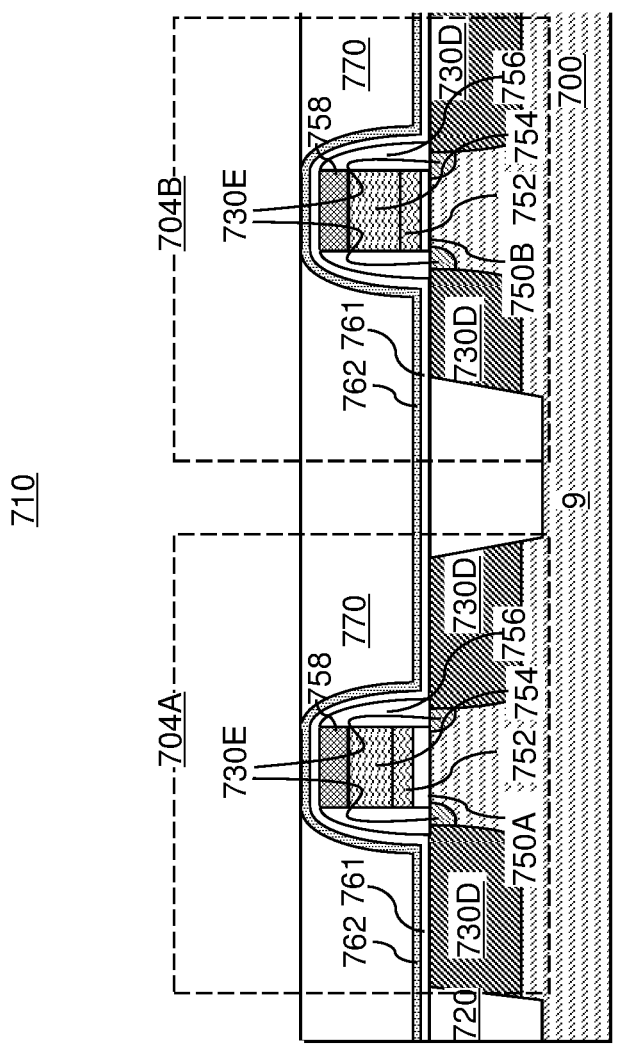
FIG. 19 is a schematic vertical cross-sectional view of a second configuration of a drain-select-level bias transistor and a bit line bias transistor in a peripheral circuit according to an aspect of the present disclosure.

Referring to FIG. 19, a second configuration of a drain-select-level bias transistor 704A and a bit line bias transistor 704B in a peripheral circuit 700 is illustrated according to an aspect of the present disclosure. In this configuration, each of the source region and the drain region of the bit line bias transistor 704B may include a deep source/drain region 730D and a source/drain extension region 730E having a lesser depth and a lower dopant concentration than the deep source/drain region 730D in order to withstand high voltage operations (such as operations at voltages in a range from 15 V to 45 V).

In one embodiment, the erase operation bias circuit 710 comprises: bit line bias transistors 704B configured to electrically bias the bit lines 98; and drain-select-level bias transistors 704A configured to electrically bias the first drain-select-level electrically conductive layers 46D1 or the second drain-select-level electrically conductive layers (46D2 or 46D3), wherein the drain-select-level bias transistors 704A have a greater gate dielectric thickness than the bit line bias transistors 704B. In one embodiment, the drain-select-level bias transistors 704A have a greater lateral width than the bit line bias transistors 704B.

In one embodiment, the bit line bias transistors 704B are configured to apply 0 V to each of the bit lines 98 during the erase operation.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
an alternating stack of insulating layers and electrically conductive layers located over a substrate, wherein the electrically conductive layers comprise:
word-line-level electrically conductive layers;
first drain-select-level electrically conductive layers overlying the word-line-level electrically conductive layers, located at a first drain select level, and laterally spaced apart from each other; and
second drain-select-level electrically conductive layers located at a second drain select level between the first drain-select-level electrically conductive layers and the word-line-level electrically conductive layers, and laterally spaced apart from each other;
blocks of vertical NAND strings that vertically extend through the alternating stack, wherein each of the vertical NAND strings comprises a respective vertical semiconductor channel, a drain region located at an upper end of the respective vertical semiconductor channel, and a respective vertical stack of memory elements located at levels of the word-line-level electrically conductive layers;
a source line electrically connected to lower ends of the vertical semiconductor channels;
bit lines overlying the vertical NAND strings and electrically connected to a respective subset of the drain regions; and
an erase operation bias circuit configured to erase the vertical NAND strings in a selected block by:
applying a relatively high erase voltage to the source line;
applying a relatively low voltage or 0 V to the bit lines;
applying a first drain-select-level voltage that is less than the erase voltage to one of the first drain-select-level electrically conductive layers located within the selected block; and
applying a second drain-select-level voltage that is greater than the first drain-select-level voltage and not greater than the erase voltage to one of the second drain-select-level electrically conductive layers located within the selected block.

2. The three-dimensional memory device of claim 1, wherein a vertical spacing between the first drain-select-level electrically conductive layers and the second drain-select-level electrically conductive layers is greater than a maximum vertical spacing between vertically neighboring pairs of the word-line-level electrically conductive layers.

3. The three-dimensional memory device of claim 2, wherein a ratio of the vertical spacing between the first drain-select-level electrically conductive layers and the second drain-select-level electrically conductive layers to the maximum vertical spacing between vertically neighboring pairs of the word-line-level electrically conductive layers is in a range from 1.1 to 6.0.

4. The three-dimensional memory device of claim 2, wherein the second drain-select-level voltage is the same as the erase voltage, and wherein 0 V is applied to the bit lines.

5. The three-dimensional memory device of claim 4, wherein the first drain-select-level voltage is 0 V, and wherein the erase voltage is at least 15 V.

6. The three-dimensional memory device of claim 1, wherein:
the electrically conductive layers further comprise third drain-select-level electrically conductive layers located at a third drain select level between the first drain-select-level electrically conductive layers and the second drain-select-level electrically conductive layers, and laterally spaced apart from each other;
the erase operation bias circuit is configured to apply a third drain-select-level voltage to the third drain-select-level electrically conductive layers; and
the third drain-select-level voltage is greater than the first drain-select-level voltage and less than the second drain-select-level voltage.

7. The three-dimensional memory device of claim 6, wherein the second drain-select-level voltage is the same as the erase voltage.

8. The three-dimensional memory device of claim 7, wherein the first drain-select-level voltage is 0 V.

9. The three-dimensional memory device of claim 8, wherein the third drain-select-level voltage is in a range from 25% to 75% of the erase voltage.

10. The three-dimensional memory device of claim 1, wherein the erase operation bias circuit is configured to maintain each of the word-line-level electrically conductive layers electrically floating, or to apply a word line voltage having a magnitude less than 10% of a magnitude of the erase voltage, during the erase operation.

11. The three-dimensional memory device of claim 1, wherein the erase operation bias circuit is configured to apply 0 V to each of the first drain-select-level electrically conductive layers that are located within unselected blocks, and is configured to apply 0 V to each of the second drain-select-level electrically conductive layers that are located within the unselected blocks.

12. The three-dimensional memory device of claim 1, wherein erase operation bias circuit comprises:
bit line bias transistors configured to electrically bias the bit lines; and
drain-select-level bias transistors configured to electrically bias the first drain-select-level electrically conductive layers or the second drain-select-level electrically conductive layers, wherein the drain-select-level bias transistors have a greater gate dielectric thickness than the bit line bias transistors.

13. The three-dimensional memory device of claim 1, wherein the source line comprises a semiconductor material layer located between the substrate and the lower end of the vertical semiconductor channels.

14. The three-dimensional memory device of claim 1, wherein the electrically conductive layers comprise:
first source select-level electrically conductive layers underlying the word-line-level electrically conductive layers, located at a first source select level, and laterally spaced apart from each other; and
second source-select-level electrically conductive layers located at a second source select level between the first source-select-level electrically conductive layers and the word-line-level electrically conductive layers, and laterally spaced apart from each other.

15. The three-dimensional memory device of claim 14, wherein:
the erase operation bias circuit is configured to apply a first source-select-level voltage that is less than the erase voltage to one of the first source-select-level electrically conductive layers located within the selected block during the erase operation;
to apply a second source-select-level voltage that is greater than the first source-select-level voltage and not greater than the erase voltage to one of the second second-select-level electrically conductive layers located within the selected block during the erase operation; and
to apply the erase voltage to each of the first source-select-level electrically conductive layers and each of the second second-select-level electrically conductive layers that are located within unselected blocks during the erase operation.

16. A method, comprising:
providing a three-dimensional memory device comprising:
an alternating stack of insulating layers and electrically conductive layers located over a substrate, wherein the electrically conductive layers comprise:
word-line-level electrically conductive layers;
first drain-select-level electrically conductive layers overlying the word-line-level electrically conductive layers, located at a first drain select level, and laterally spaced apart from each other; and
second drain-select-level electrically conductive layers located at a second drain select level between the first drain-select-level electrically conductive layers and the word-line-level electrically conductive layers, and laterally spaced apart from each other;
blocks of vertical NAND strings that vertically extend through the alternating stack, wherein each of the vertical NAND strings comprises a respective vertical semiconductor channel, a drain region located at an upper end of the respective vertical semiconductor channel, and a respective vertical stack of memory elements located at levels of the word-line-level electrically conductive layers;
a source line electrically connected to lower ends of the vertical semiconductor channels;
bit lines overlying the vertical NAND strings and electrically connected to a respective subset of the drain regions; and
erasing the vertical NAND strings from a source side of the vertical NAND strings in a selected block by:
applying a relatively high erase voltage to the source line;
applying a relatively low voltage or 0 V to the bit lines;
applying a first drain-select-level voltage that is less than the erase voltage to one of the first drain-select-level electrically conductive layers located within the selected block; and
applying a second drain-select-level voltage that is greater than the first drain-select-level voltage and not greater than the erase voltage to one of the second drain-select-level electrically conductive layers located within the selected block.

17. The method of claim 16, further comprising maintaining each of the word-line-level electrically conductive layers electrically floating, or applying a word line voltage having a magnitude less than 10% of a magnitude of the erase voltage, during the erase operation.

18. The method of claim 16, further comprising:
applying 0 V to each of the first drain-select-level electrically conductive layers that are located within unselected blocks during the erase operation; and
applying 0 V to each of the second drain-select-level electrically conductive layers that are located within the unselected blocks during the erase operation.

19. The method of claim 16, further comprising:
applying a first source-select-level voltage that is less than the erase voltage a first source-select-level electrically conductive layer located within the selected block during the erase operation; and
applying a second source-select-level voltage that is greater than the first source-select-level voltage and not greater than the erase voltage to a second second-select-level electrically conductive layer located between the first source-select-level electrically conductive layer and the word-line-level electrically conductive layers within the selected block during the erase operation.

\* \* \* \* \*